(12) United States Patent
Lee et al.

(10) Patent No.: US 11,929,401 B2
(45) Date of Patent: Mar. 12, 2024

(54) METHOD OF FORMING A SOURCE/DRAIN

(71) Applicant: Taiwan Semiconductor Manufacturing Co., Ltd., Hsinchu (TW)

(72) Inventors: Chien-Wei Lee, Kaohsiung (TW); Hsueh-Chang Sung, Zhubei (TW); Yen-Ru Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 60 days.

(21) Appl. No.: 17/567,546

(22) Filed: Jan. 3, 2022

(65) Prior Publication Data
US 2022/0123117 A1    Apr. 21, 2022

Related U.S. Application Data

(63) Continuation of application No. 16/677,798, filed on Nov. 8, 2019, now Pat. No. 11,217,672.

(60) Provisional application No. 62/894,392, filed on Aug. 30, 2019.

(51) Int. Cl.
| | |
|---|---|
| H01L 29/165 | (2006.01) |
| C30B 25/10 | (2006.01) |
| C30B 25/12 | (2006.01) |
| C30B 25/16 | (2006.01) |
| H01L 21/02 | (2006.01) |
| H01L 21/324 | (2006.01) |
| H01L 29/417 | (2006.01) |
| H01L 29/66 | (2006.01) |

(52) U.S. Cl.
CPC .......... *H01L 29/165* (2013.01); *C30B 25/10* (2013.01); *C30B 25/12* (2013.01); *C30B 25/165* (2013.01); *H01L 21/02315* (2013.01); *H01L 21/02658* (2013.01); *H01L 21/02661* (2013.01); *H01L 21/3247* (2013.01); *H01L 29/41791* (2013.01); *H01L 29/66636* (2013.01); *H01L 29/66795* (2013.01)

(58) Field of Classification Search
CPC .......... H01L 29/66636; H01L 21/3247; H01L 21/02315
See application file for complete search history.

(56) References Cited

U.S. PATENT DOCUMENTS

| | | | |
|---|---|---|---|
| 8,487,378 B2 | 7/2013 | Goto et al. | |
| 8,729,634 B2 | 5/2014 | Shen et al. | |
| 8,826,213 B1 | 9/2014 | Ho et al. | |
| 8,887,106 B2 | 11/2014 | Ho et al. | |
| 2010/0221895 A1* | 9/2010 | Seino | H01L 21/0262 438/719 |
| 2010/0304561 A1* | 12/2010 | Narushima | H01L 21/67207 438/653 |
| 2014/0282326 A1 | 9/2014 | Chen et al. | |
| 2015/0129131 A1 | 5/2015 | Li et al. | |

(Continued)

*Primary Examiner* — Farun Lu
(74) *Attorney, Agent, or Firm* — Slater Matsil, LLP

(57) ABSTRACT

Embodiments provide a way of treating source/drain recesses with a high heat treatment and an optional hydrogen plasma treatment. The high heat treatment smooths the surfaces inside the recesses and remove oxides and etching byproducts. The hydrogen plasma treatment enlarges the recesses vertically and horizontally and inhibits further oxidation of the surfaces in the recesses.

20 Claims, 26 Drawing Sheets

(56) References Cited

U.S. PATENT DOCUMENTS

2015/0147861 A1* 5/2015 Park ................ H01L 21/823481
                                                        438/283
2019/0019690 A1* 1/2019 Choi ................ H01L 29/66795
2019/0157425 A1* 5/2019 Liu .................... H01L 29/0847

* cited by examiner

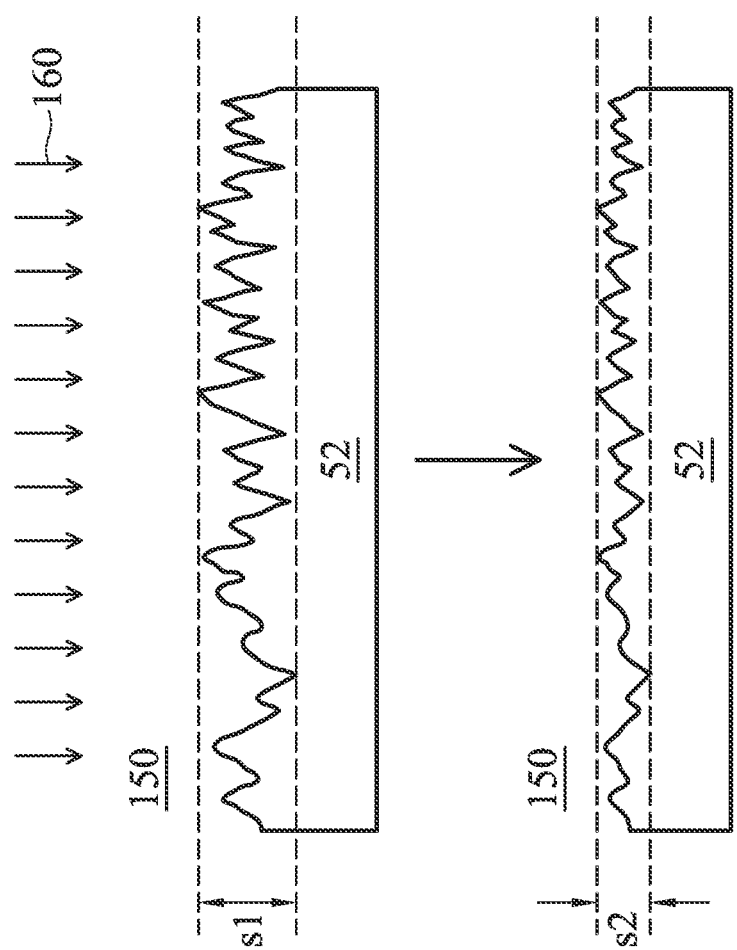

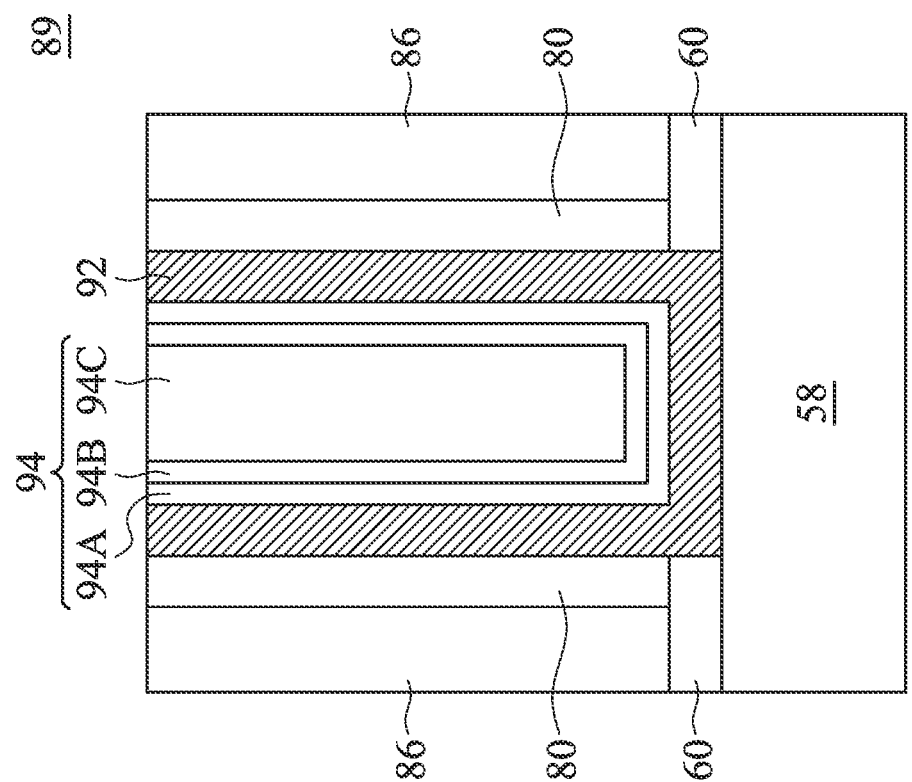

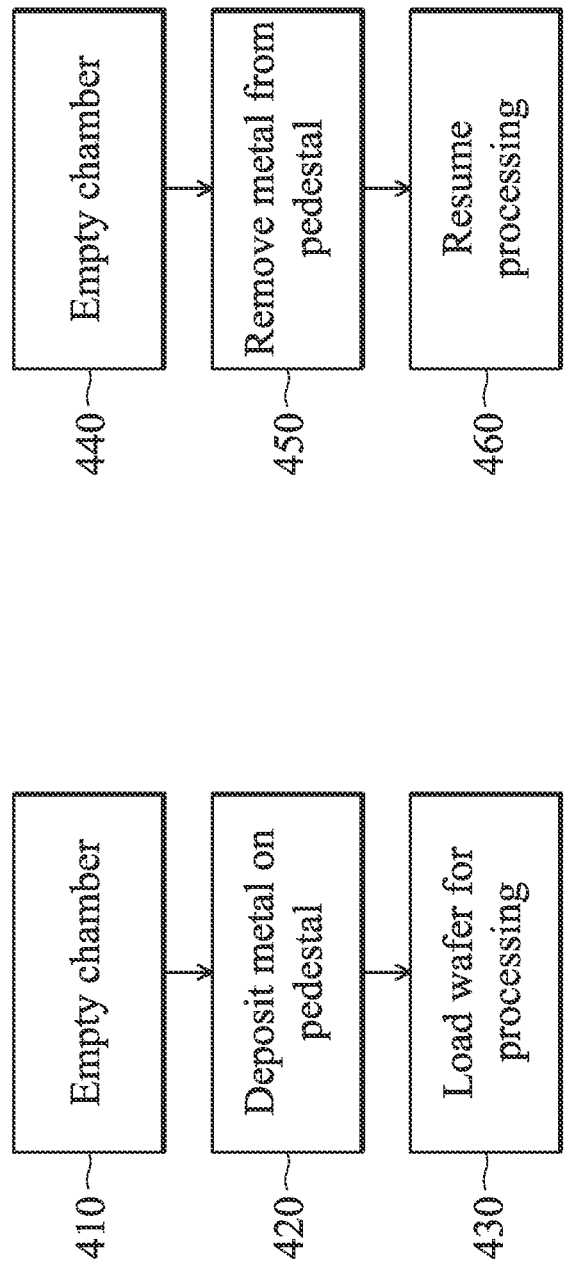

METHOD OF FORMING A SOURCE/DRAIN

PRIORITY CLAIM AND CROSS-REFERENCE

This application is a continuation of U.S. application Ser. No. 16/677,798 filed on Nov. 8, 2019, which claims the benefit of U.S. Provisional Patent Application No. 62/894,392, entitled "Method of Forming a Source/Drain," filed on Aug. 30, 2019, which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 11A, 11B, 11C, 12A, 12B, 13A, 13B, 14A, 14B, 14C, 14D, 15A, 15B, 16A, 16B, 17A, 17B, 18A, 18B, 18C, 19A, 19B, 20A, and 20B are cross-sectional views of intermediate stages in the manufacturing of FinFETs, in accordance with some embodiments.

FIGS. 23 and 24 are process flow diagrams for adding or removing a metal coating from a pedestal, in accordance with some embodiments.

DETAILED DESCRIPTION

Figure 1:
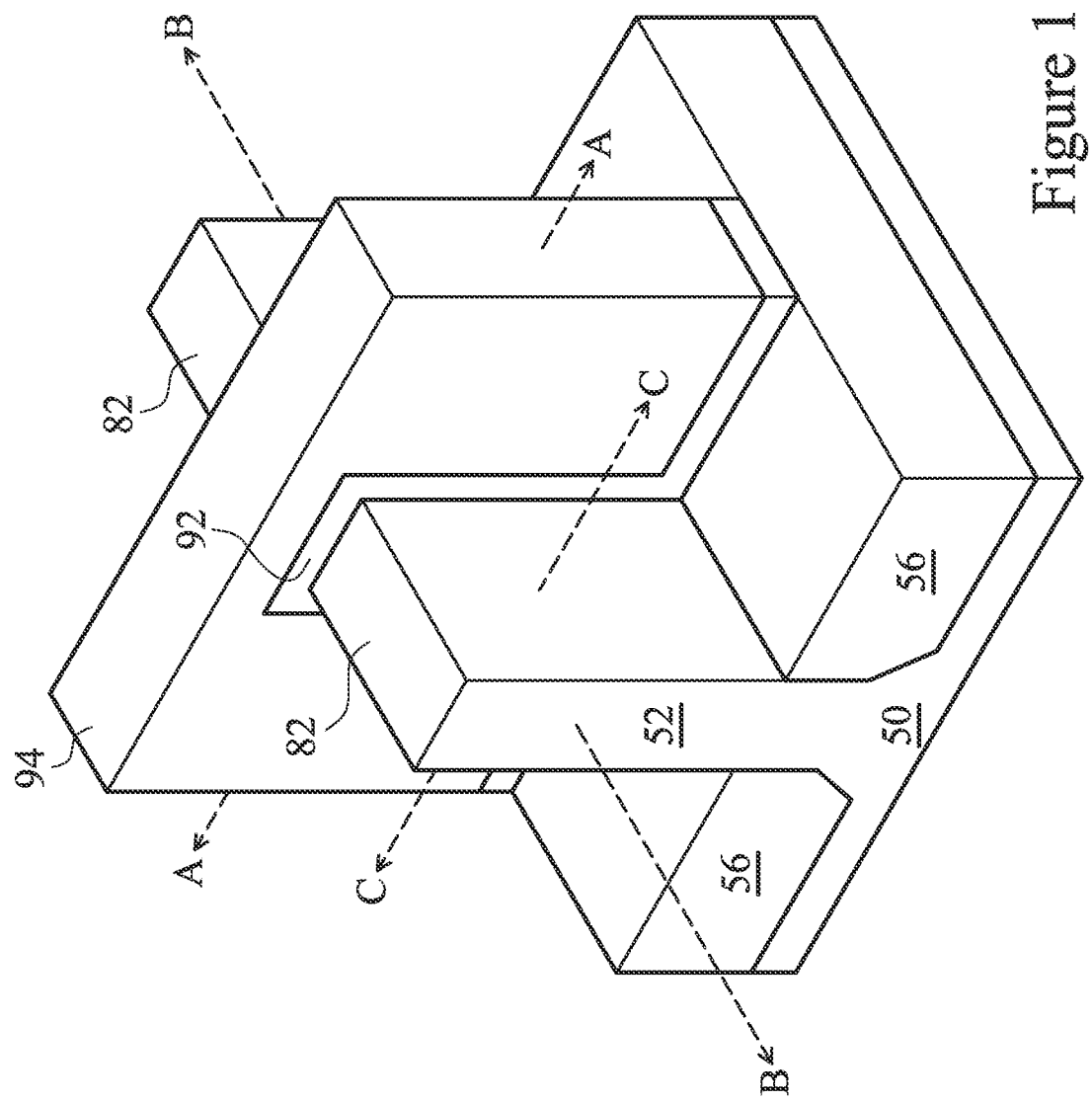
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In forming a source/drain region of a Fin Field-Effect Transistor (FinFET), an area of the fin corresponding to the source/drain region may be recessed and an epitaxial semiconductor material grown in the recess. In the process of recessing the source/drain region, however, the recess may have a rough surface which negatively impacts the quality of the epitaxial source/drain region. Embodiments include processes to provide a smooth surface of the recesses prior to forming the epitaxial source/drain regions. One embodiment includes a high temperature process in a modified processing chamber to remove oxide and another embodiment also includes a hydrogen radical treatment to prevent re-oxidation and to boost clean efficiency. After this process, the subsequently formed epitaxial source/drain regions provide increased device current performance. In particular, the ratio of the drive current (Ideff) to the leakage current (Ioff) may be increased by 3% to 4%. In other words, the leakage current is reduced. Also, Ion may be boosted by the better epitaxy growth of the source/drain regions achieved by the processes described herein. Further, the yield window for better landing for a subsequently formed contact may be achieved. In other words, because the epitaxy has a higher quality, the upper surfaces of the epitaxy have a larger effective landing area to receive a contact, thereby increasing overall yield.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Epitaxial source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the epitaxial source/drain regions 82 of the FinFET. Cross-section B-B is perpendicular to cross-section A-A and is along a longitudinal axis of the fin 52 and in a direction of, for example, a current flow between the epitaxial source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 2 through 16B are cross-sectional views of intermediate stages in the manufacturing of FinFETs, in accordance with some embodiments. FIGS. 2 through 7 illustrate reference cross-section A-A illustrated in FIG. 1, except for multiple fins/FinFETs. FIGS. 8A, 9A, 10A, 11A, 12A, 13A, 14A, 15A, 16A, 17A, 18A, 19A, and 20A are illustrated along reference cross-section A-A illustrated in FIG. 1, and FIGS. 8B, 9B, 10B, 11B, 12B, 13B, 14B, 15B, 16B, 17B, 18B, 18C, 19B, and 20B are illustrated along a similar cross-section B-B illustrated in FIG. 1, except for multiple fins/FinFETs. FIGS. 14C and 14D are illustrated along reference cross-section C-C illustrated in FIG. 1, except for multiple fins/FinFETs. FIG. 11C is a close up view of the substrate surface as described below.

Figure 2:
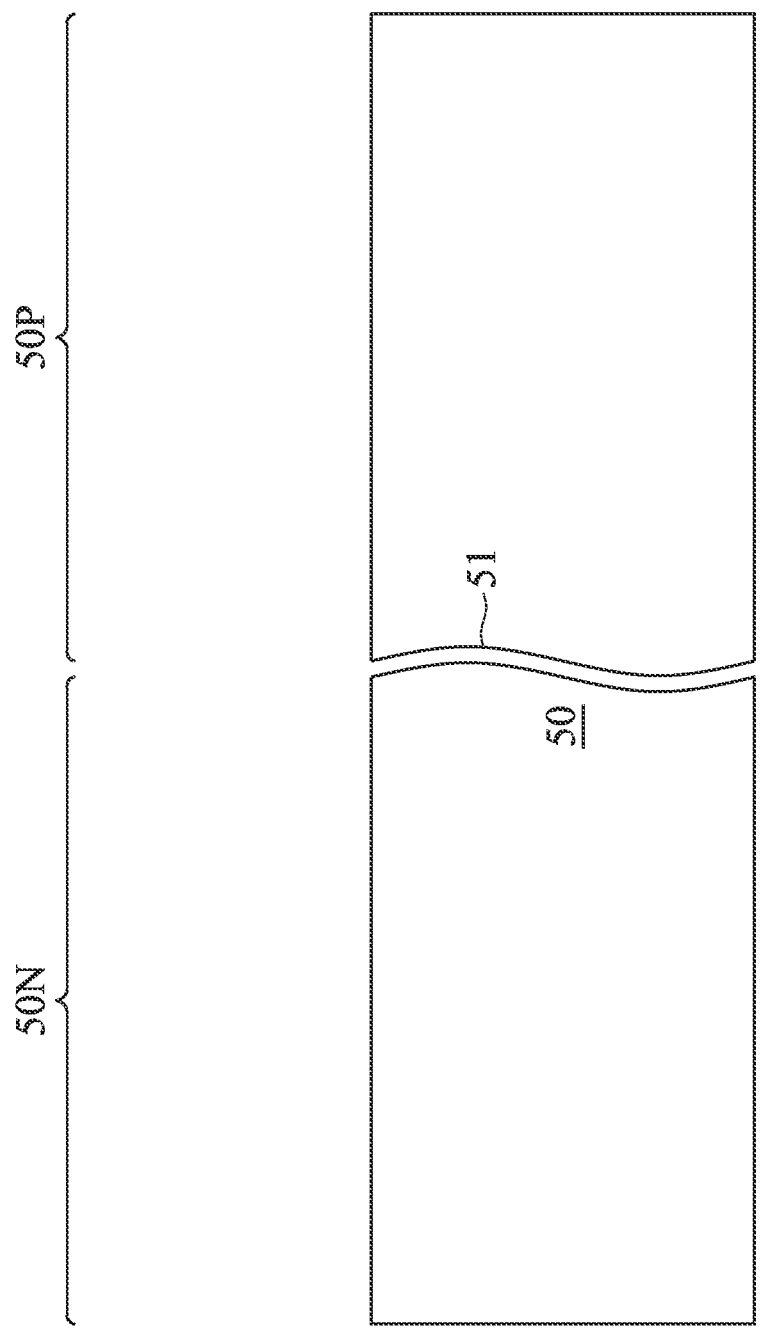

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

Figure 3:
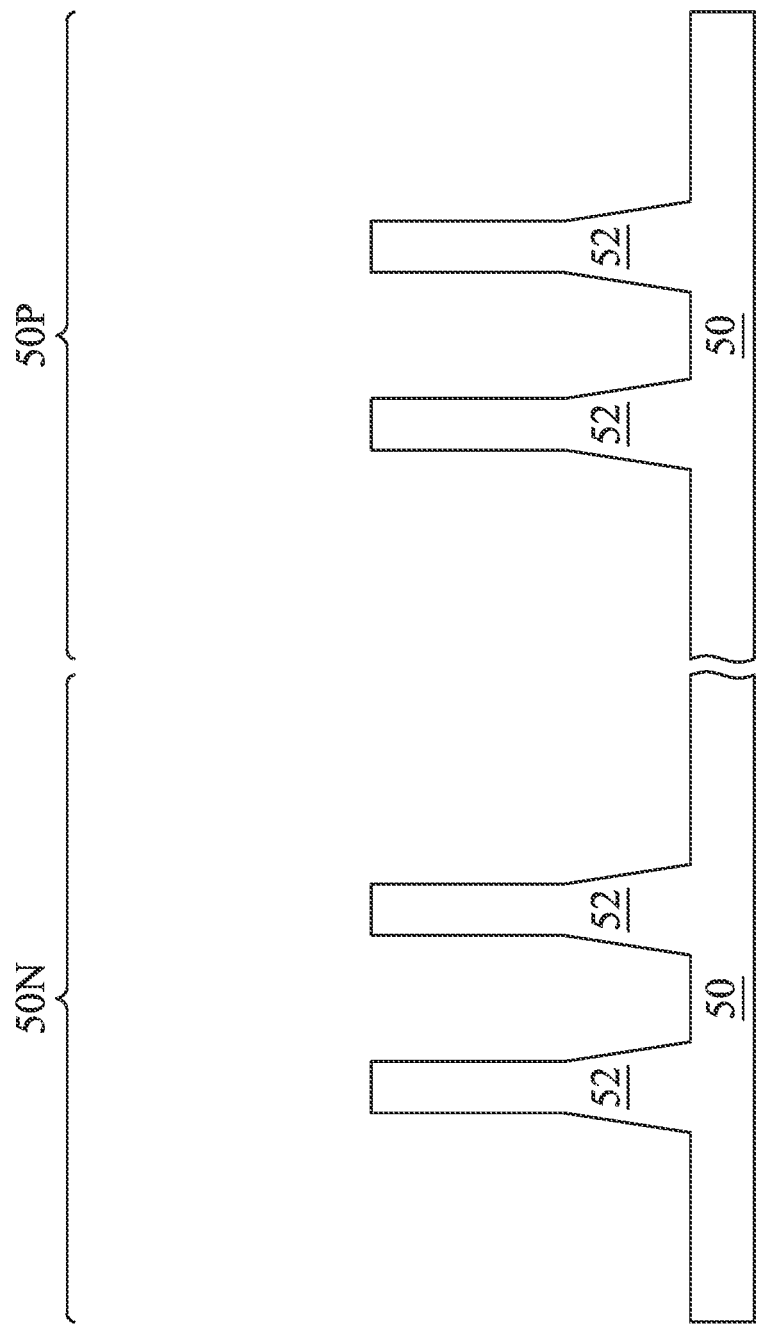

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the mask (or other layer) may remain on the fins 52.

Figure 4:
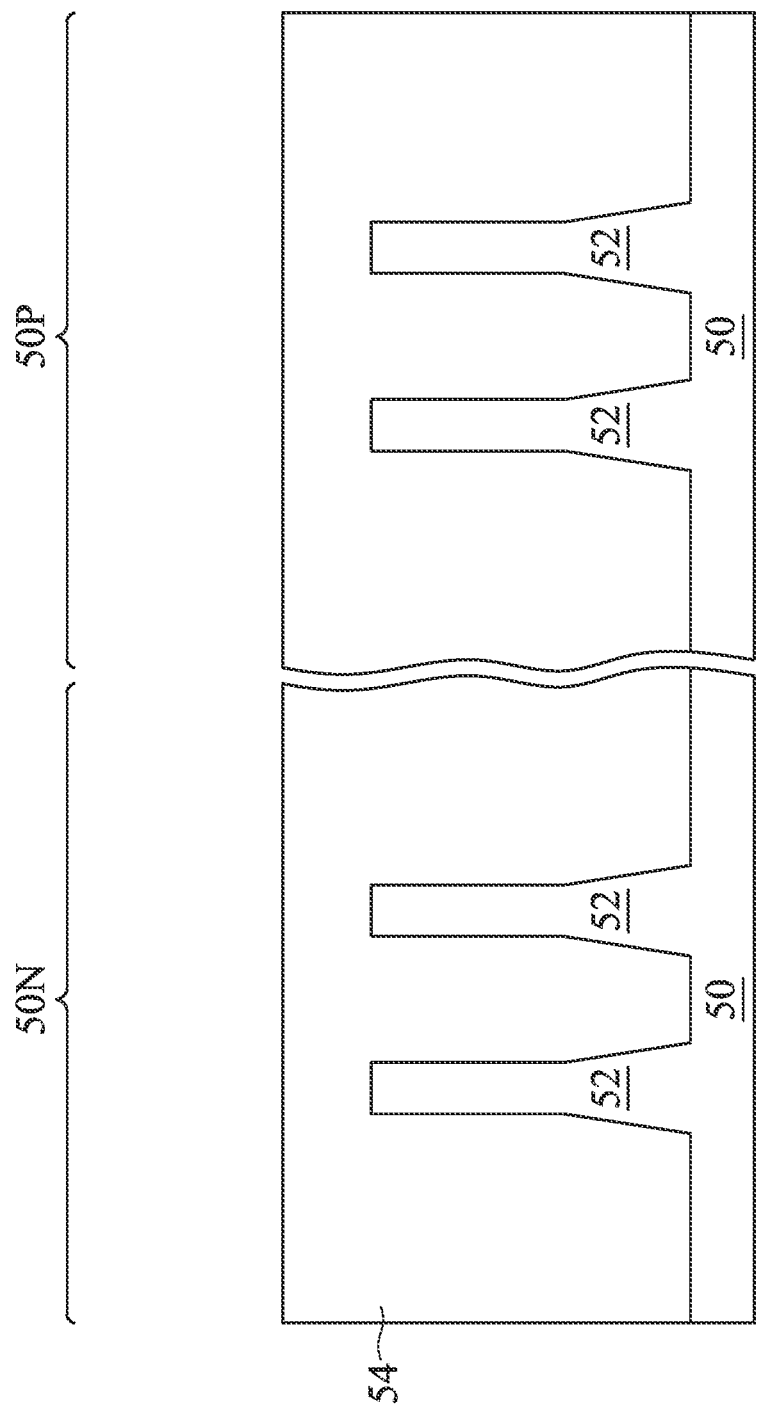

In FIG. 4, an insulation material 54 is formed over the substrate 50 and between neighboring fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments a liner (not shown) may first be formed along a surface of the substrate 50 and the fins 52. Thereafter, a fill material, such as those discussed above may be formed over the liner.

Figure 5:
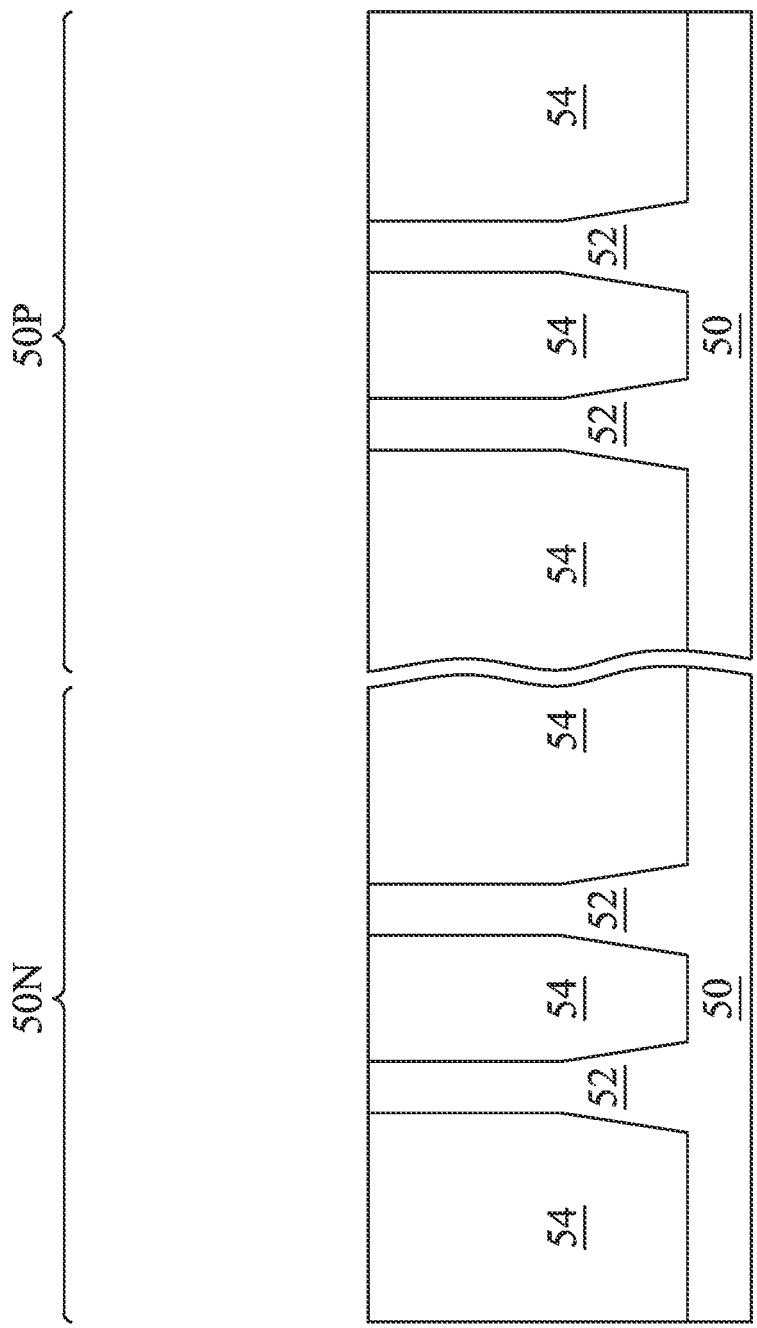

In FIG. 5, a removal process is applied to the insulation material 54 to remove excess insulation material 54 over the fins 52. In some embodiments, a planarization process such as a chemical mechanical polish (CMP), an etch-back process, combinations thereof, or the like may be utilized. The planarization process exposes the fins 52 such that top surfaces of the fins 52 and the insulation material 54 are level after the planarization process is complete. In embodiments in which a mask remains on the fins 52, the planarization process may expose the mask or remove the mask such that top surfaces of the mask or the fins 52, respectively, and the insulation material 54 are level after the planarization process is complete.

Figure 6:
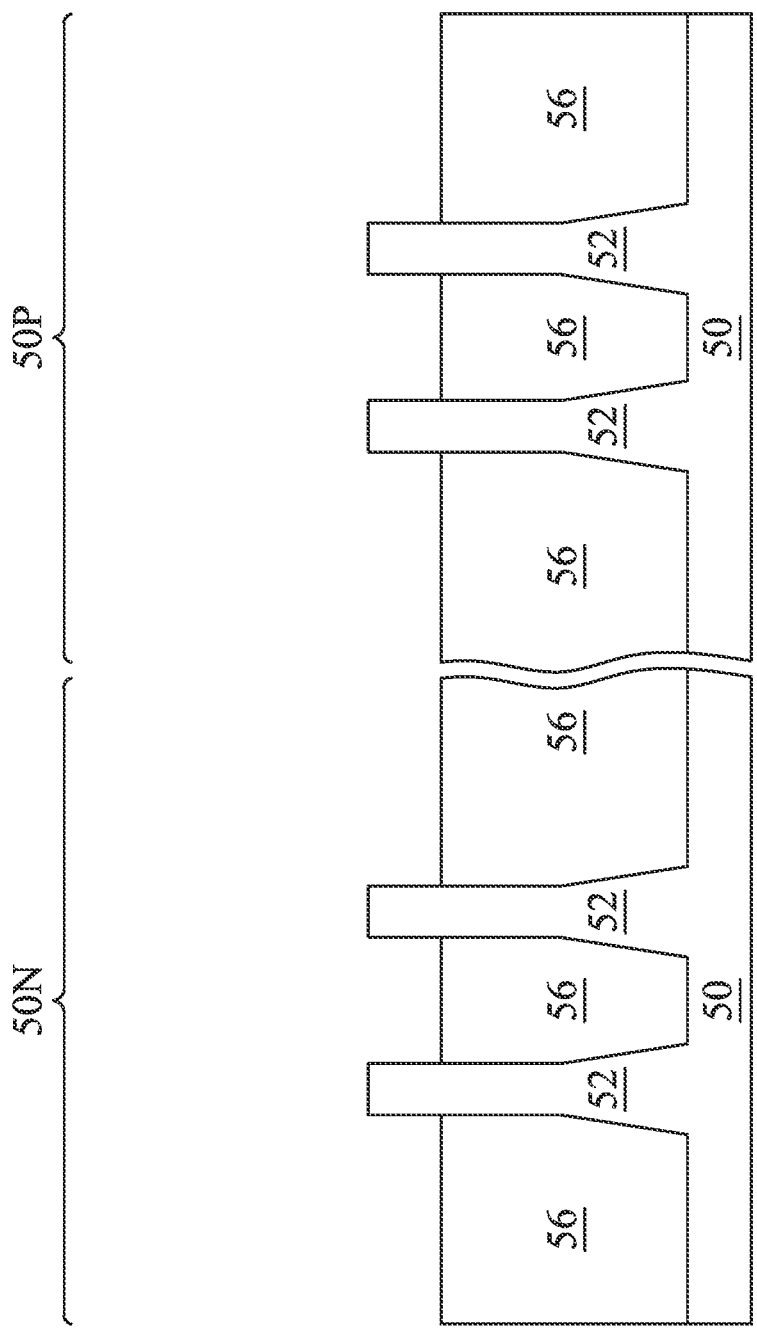

In FIG. 6, the insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, an oxide removal using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, the fins 52 in FIG. 5 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 6, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like implanted in the region to a concentration of equal to or less than $10^{18}$ $cm^{-3}$, such as between about $10^{16}$ $cm^{-3}$ and about $10^{18}$ $cm^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 7:
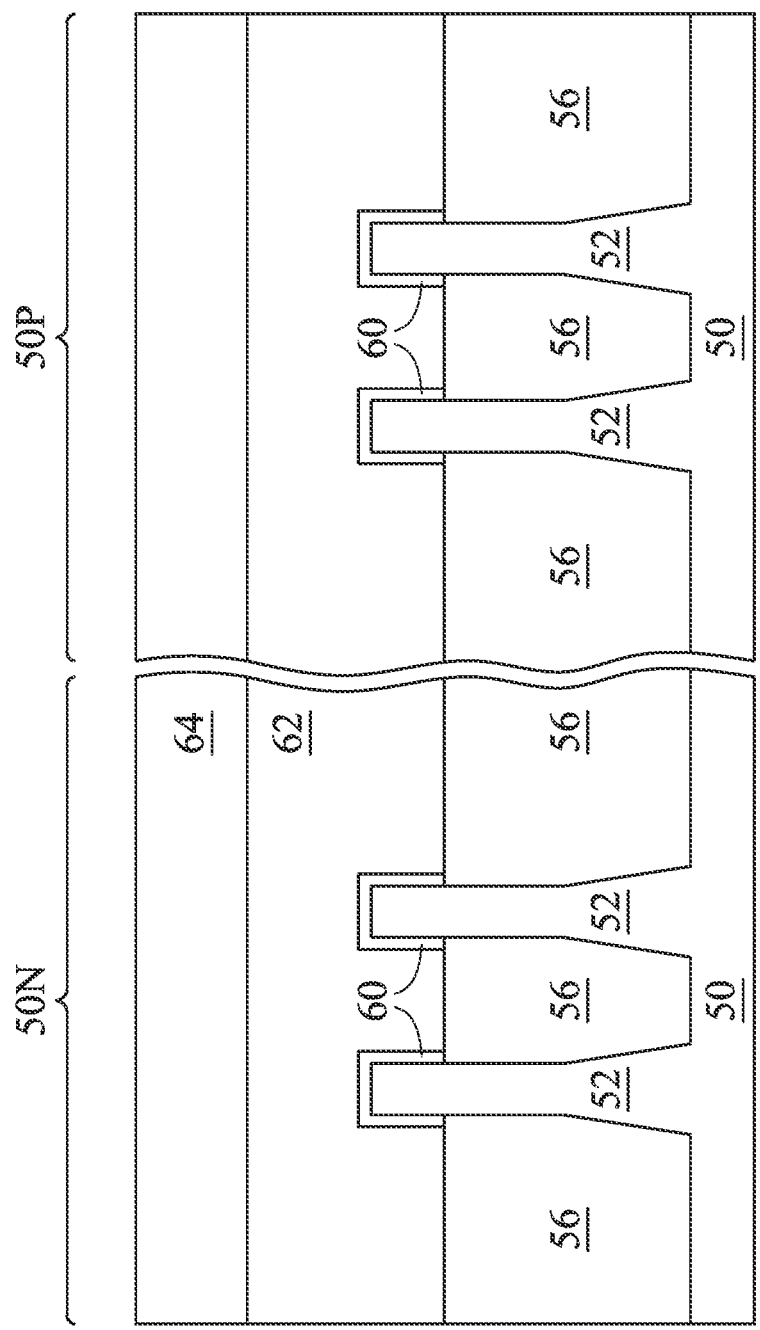

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques known and used in the art for depositing the selected material. The dummy gate layer 62 may be made of other materials that have a high etching selectivity from the etching of isolation regions. The mask layer 64 may include, for example, silicon nitride, silicon oxynitride, or the like. In this example, a single dummy gate layer 62 and a single mask layer 64 are formed across the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A through 16B illustrate various additional steps in the manufacturing of embodiment devices. FIGS. 8A through 16B illustrate features in either of the region 50N and the region 50P. For example, the structures illustrated in FIGS. 8A through 16B may be applicable to both the region 50N and the region 50P. Differences (if any) in the structures of the region 50N and the region 50P are described in the text accompanying each figure.

Figure 8A:
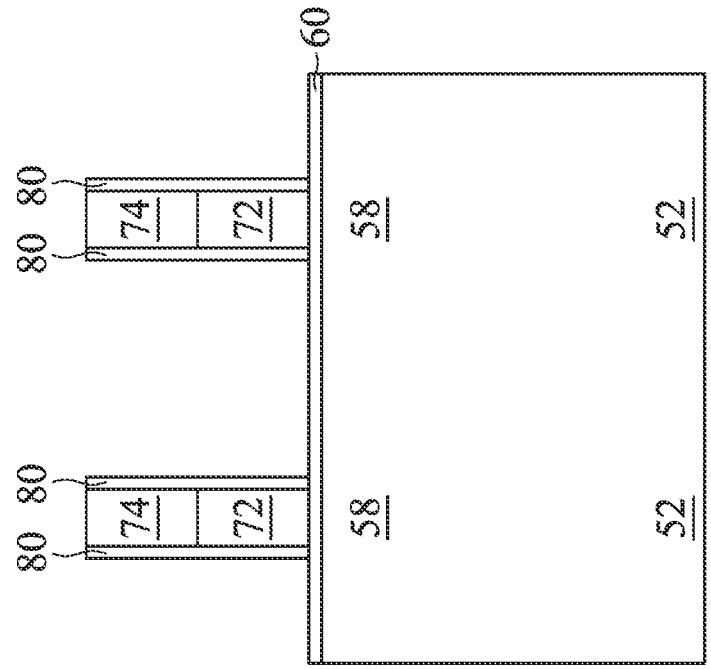
Figure 8B:
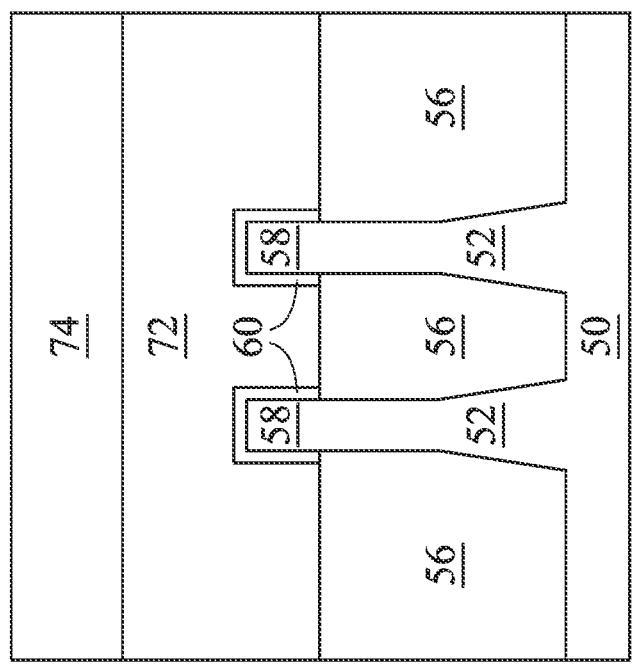

In FIGS. 8A and 8B, the mask layer 64 (see FIG. 7) may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 8A and 8B, gate seal spacers 80 can be formed on exposed surfaces of the dummy gates 72, the masks 74, and/or the fins 52. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not explicitly illustrated) may be performed. In the embodiments with different device types, similar to the implants discussed above in FIG. 6, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Figure 9B:
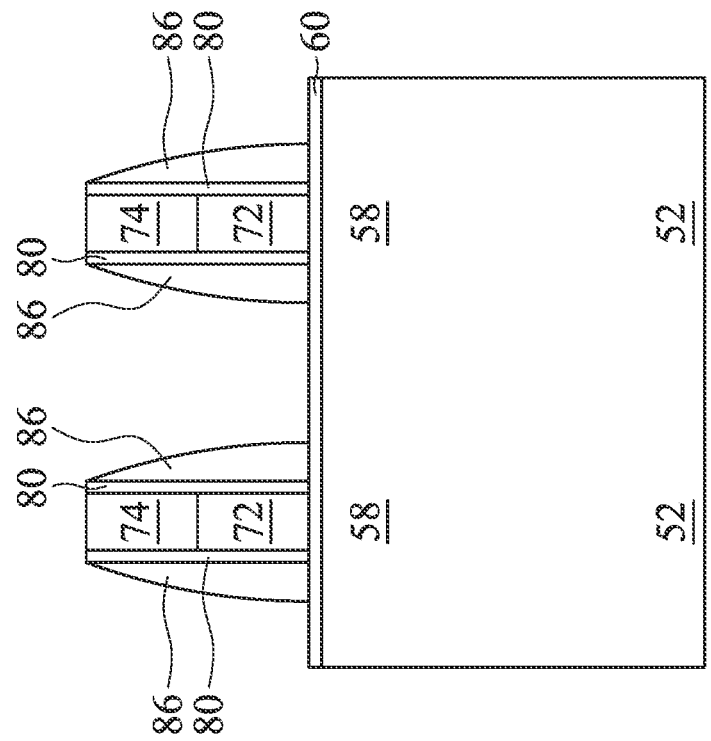
Figure 9A:
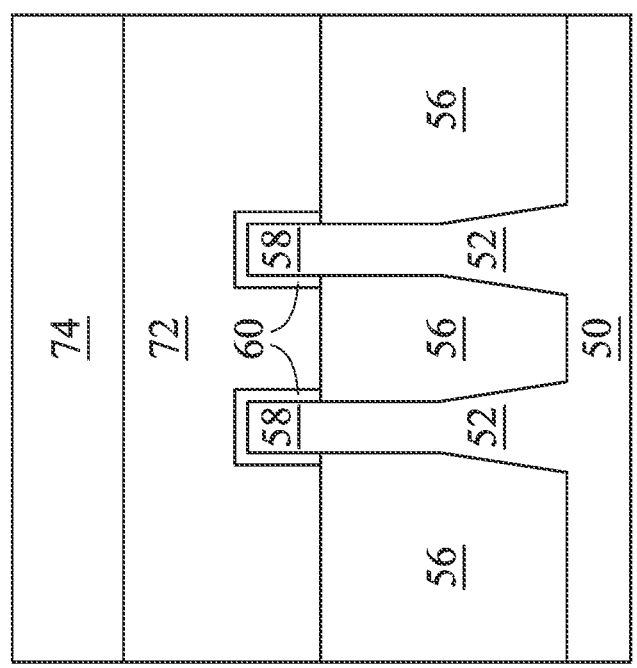

In FIGS. 9A and 9B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon oxide, silicon nitride, silicon oxynitride, silicon carbonitride, a combination thereof, or the like.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 86, yielding "L-shaped" gate seal spacers, spacers may be formed and removed, and/or the like. Furthermore, the n-type and p-type devices may be formed using a different structures and steps. For example, LDD regions for n-type devices may be formed prior to forming the gate seal spacers 80 while the LDD regions for p-type devices may be formed after forming the gate seal spacers 80.

In FIGS. 10A, 10B, 11A, 11B, 12A, 12B, 13A, 13B, 14A, 14B, 14C, and 14D a process of forming epitaxial source/drain regions 82 (see, e.g., FIG. 14B) is described. The epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into, and may also penetrate through, the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

Figure 10B:
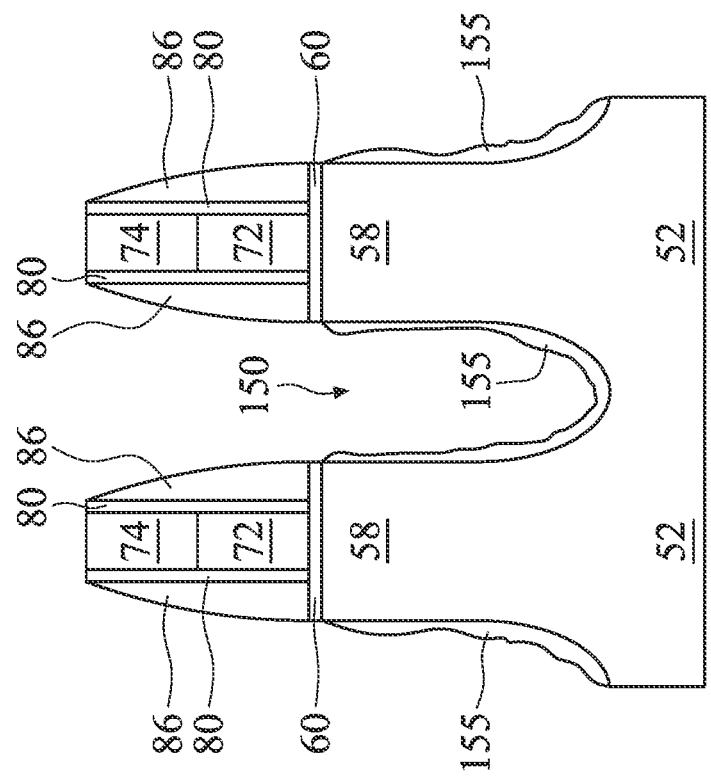
Figure 10A:
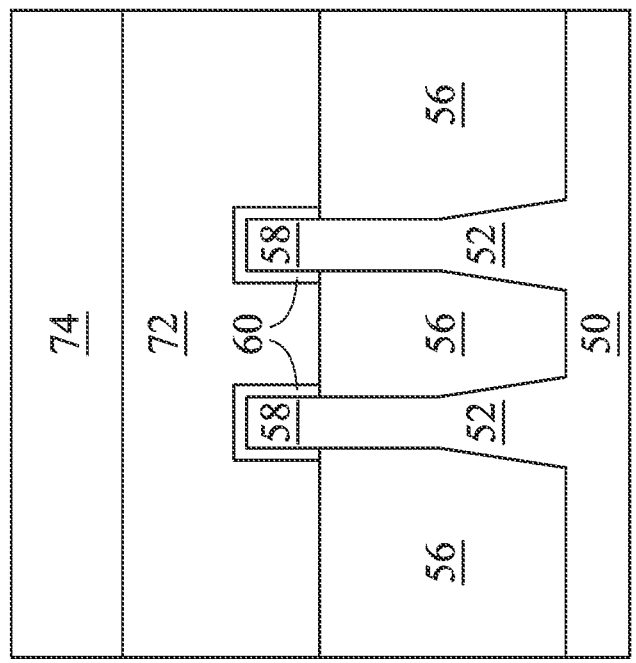
Figure 11B:
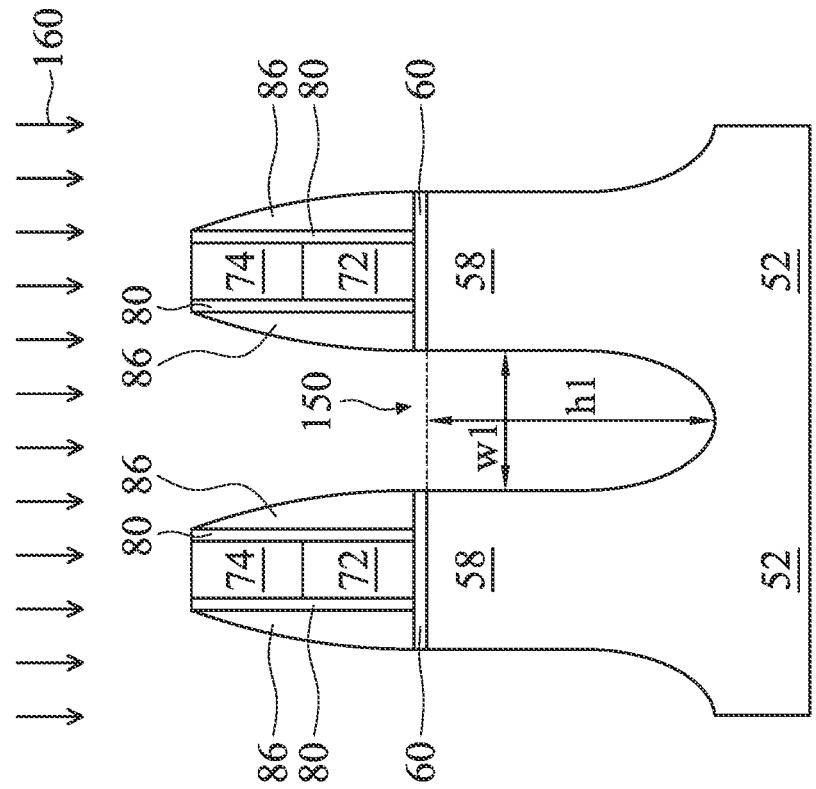

In FIGS. 10A and 10B, the epitaxial source/drain regions 82 in the region 50N, e.g., the NMOS region, may be formed by masking the region 50P, e.g., the PMOS region, and etching source/drain regions of the fins 52 in the region 50N to form recesses 150 in the fins 52. Similarly, the epitaxial source/drain regions 82 in the region 50P, e.g., the PMOS region, may be formed by masking the region 50N, e.g., the NMOS region, and etching source/drain regions of the fins 52 in the region 50P are etched to form recesses 150 in the fins 52. The recesses 150 in the region 50N and the recesses 150 in the region 50P may be formed in the same or different processes. The epitaxial source/drain regions 82 may then be formed in different processes in each of the region 50N and the region 50P using suitable materials as described in further detail below.

The recesses 150 may be formed using any suitable process, such as by a dry etch such as a reactive ion etch (RIE) or a wet etch using suitable materials. As a result of the etching of the recesses 150, residues 155 may be left in the recesses 150. Such residues 155 may include by-products of the etching process as well as oxides of the material of the fins 52.

Figure 11A:
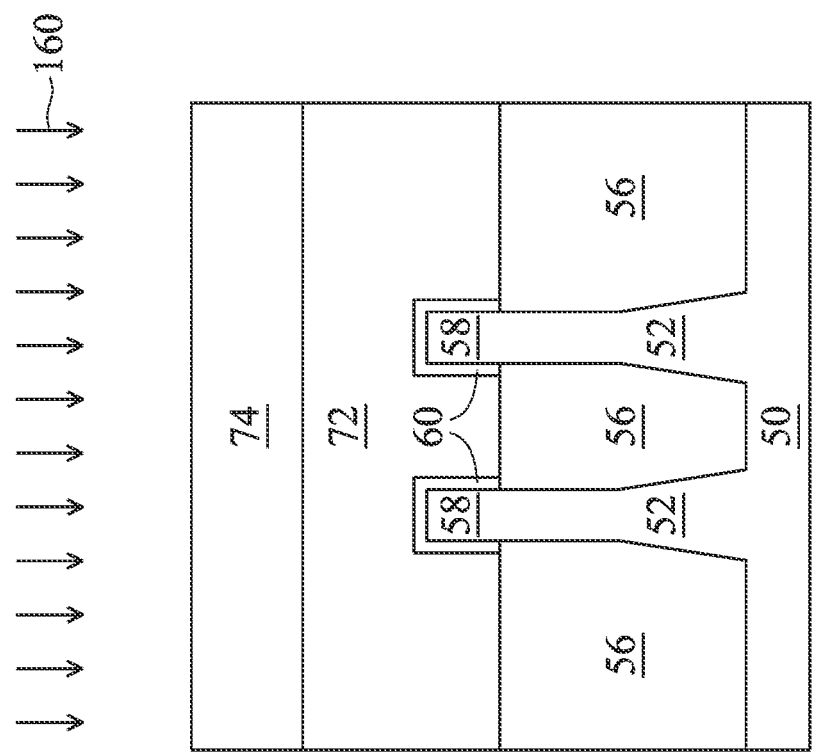

In FIGS. 11A, 11B, and 11C, the recesses 150 are subjected to a high heat treatment 160 which causes the residues 155 to burn off, including burning off the by-products and oxides. In some embodiments the high heat treatment 160 may be performed in a hydrogen environment, thereby causing reactions between the residues 155 and the hydrogen which then may be evacuated from the processing chamber containing the substrate 50. As a result of the high heat treatment 160, the surface smoothness is increased, thereby providing a base for a better epitaxial source/drain region 82 in those recesses 150. In FIG. 11C, a close-up cross-sectional view of the substrate 50 is provided, illustrating the surface smoothness s1 of the substrate 50 in the recesses 150 (top figure) prior to the high heat treatment 160 and the surface smoothness s2 of the substrate 50 in the recesses 150 (bottom figure) following the high heat treatment 160. The surface smoothness measure s1 and s2 are root-mean-square (RMS) calculated value of the vertical distance from peak to valley of the surface of the recesses 150. In some embodiments, the surface smoothness s2 of the surface of the recesses 150 following the high heat treatment 160 may be between about 0.24 nm RMS and 0.26 nm RMS, such as about 0.25 nm RMS. Prior to the high heat treatment 160, the surface smoothness s1 may be between about 0.26 nm RMS and 0.28 nm RMS, such as about 0.27 nm RMS. Accordingly, the nm RMS may be decreased by about 0.1 Å RMS to about 0.4 Å RMS smoothness of the openings 150 may be increased by about 6% to about 12%, though other values are contemplated.

The high heat treatment 160 may be performed by subjecting the openings to a temperature between about 700° C. and about 900° C., such as about 800° C., for between about 60 sec and 120 sec, such as about 90 sec. The high heat treatment 160 may be performed in a vacuum environment about 100 torr to about 200 torr, such as about 150 torr, though other values may be used. In some embodiments, a hydrogen environment may be provided by flowing hydrogen into the chamber at a flow rate between about 25000 sccm and about 31000 sccm, such as about 28000 sccm.

In some embodiments, a separate coating process may be used to coat the pedestal of the processing chamber with metal coating. This pedestal holds substrate 50 during the high heat treatment 160. The metal coating may be used to prevent materials from the pedestal from leaching into the substrate 50 during the high heat treatment 160. The coating process is described further below with respect to FIGS. 23 through 24.

The recesses 150 may have a height h1 and a width w1. The height h1 may be measured from the bottom most point of the recess 150 vertically to the top of the fin 52. The width w1 may be measured at the widest point of the recess 150. In some embodiments, h1 may be between about 40 nm and about 60 nm, such as between about 48 nm and about 50 nm, though other values are contemplated and may be used. In some embodiments, w1 may be between about 18 nm and about 28 nm, such as between about 22 nm and about 24 nm, though other values are contemplated and may be used.

Figure 12B:
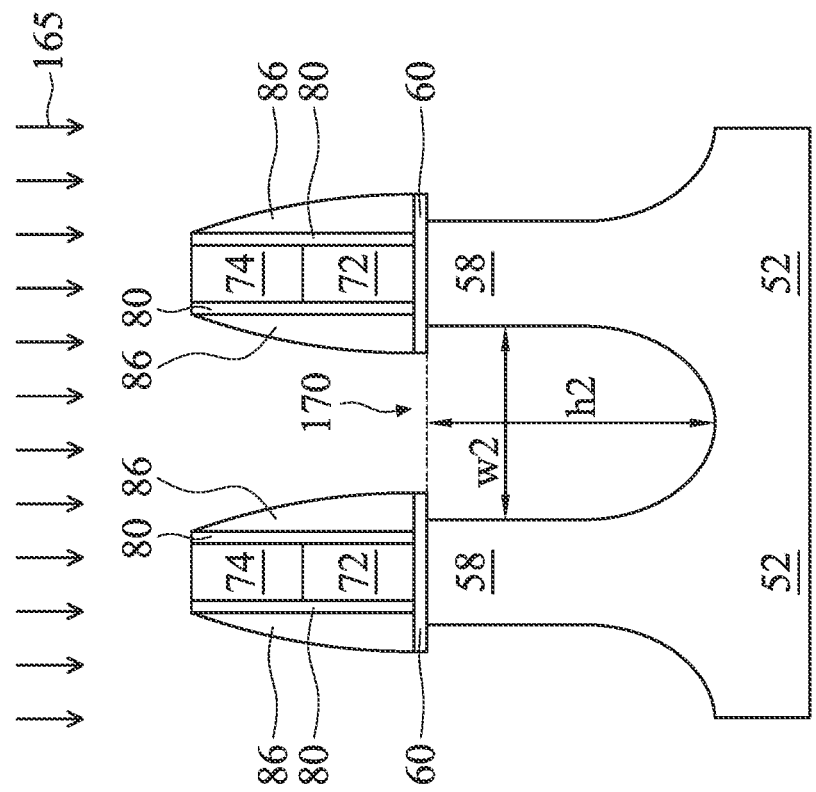
Figure 12A:
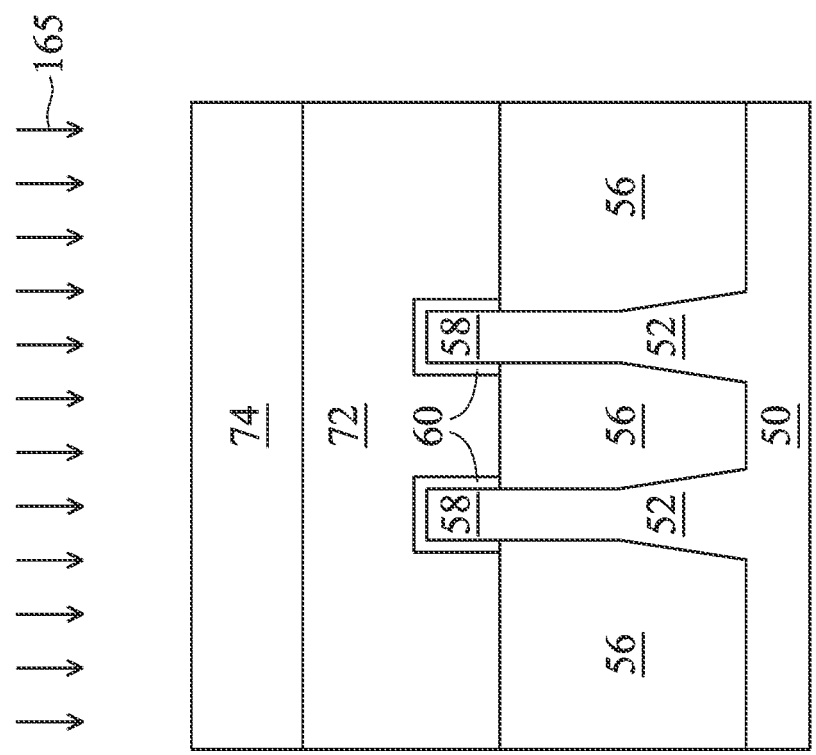

In FIGS. 12A and 12B, in some embodiments, an optional hydrogen radical treatment 165 may be performed. The hydrogen radical treatment 165 provides hydrogen radicals to the recesses 150. The hydrogen radicals cause the recesses 150 to become further recessed and widened beyond the lateral extents of the original masks which were used to create the recesses 150. The deeper and wider recesses 170 have a height h2 and a width w2. The height h2 may be measured from the bottommost point of the recess 170 vertically to the top of the fin 52. The width w2 may be measured at the widest point of the recess 170. In some embodiments, the lateral extents of the width of the recesses 170 may be vertically aligned with a portion of the gate spacer 86. In some embodiments, the lateral extents of the width of the recesses 170 may be vertically aligned with a portion of the gate seal spacer 80.

In some embodiments, h2 may be between about 41 nm and about 71 nm, such as between about 49 nm and about 51 nm, though other values are contemplated and may be used. In some embodiments, w2 may be between 20 nm and about 34 nm, such as between about 24 nm and about 29 nm, though other values are contemplated and may be used. Thus, as a result of the hydrogen radical treatment 165, the width may be increased by about 10% to about 30% and the height may be increased by about 2% to about 7%, though other values outside of these ranges may be attained, and are contemplated. Also, as a result of the hydrogen radical treatment 165, the width w2 of the recesses 170 may be increased by 2 nm to 6 nm over the width w1 of the recesses 150, and the height h2 of the recesses 170 may be increased by 1 to 3 nm over the height h1 of the recesses 150.

The hydrogen radical treatment 165 provides hydrogen radicals to the surfaces of the recesses 150 of FIG. 11B. The hydrogen radicals may be formed from a remote plasma source, such as discussed below with respect to FIG. 22. A plasma may be formed from hydrogen gas. The remote plasma will generate ions and radicals of the hydrogen gas. The ions may be deflected by a charged transfer tube or other charged plates which will attract the hydrogen ions, thereby not allowing the hydrogen ions from substantially passing to the processing chamber. Radicals of the hydrogen enter the processing chamber and contact the substrate 50 in the recesses 150. The radicals of the hydrogen will interact with and react with the materials of the substrate 50 and any further residues which may be left following the high heat treatment 160. In some embodiments, the hydrogen may react with the silicon to form a stable silicon hydrogen compound, such as silane, disilane, or trisilane at the surface of the substrate 50 inside the recesses 170. The silicon hydrogen compound in the recesses 170 is more resistant to oxidation over, for example, the untreated recesses 150 of FIG. 11B.

As a result of the hydrogen radical treatment 165, re-oxidation of the recesses 170 may be reduced or prevented when the substrate 50 is moved to a deposition chamber for growing the epitaxial source/drain regions 82, due to the presence of the chemically stable silicon hydrogen compounds. The hydrogen radical treatment 165 also boosts the cleaning efficiency of the high heat treatment 160 and may also boost the cleaning efficiency of a separate cleaning process which may be performed after the hydrogen radical treatment 165 and prior to the growing of the epitaxial source/drain regions 82.

After forming the epitaxial source/drain regions 82 (further described below), in embodiments using the hydrogen radical treatment 165, a concentration of hydrogen may be found at the interface between the epitaxial source/drain regions 82 and the substrate 50. The concentration of hydrogen may be greatest at the interface and have a first gradient of decreasing concentration further into the substrate 50 and a second gradient of decreasing concentration further into the subsequently formed epitaxial source/drain regions 82, which may have hydrogen diffuse from the substrate 50 into the epitaxial source/drain regions 82 in subsequent processing.

Figure 13B:
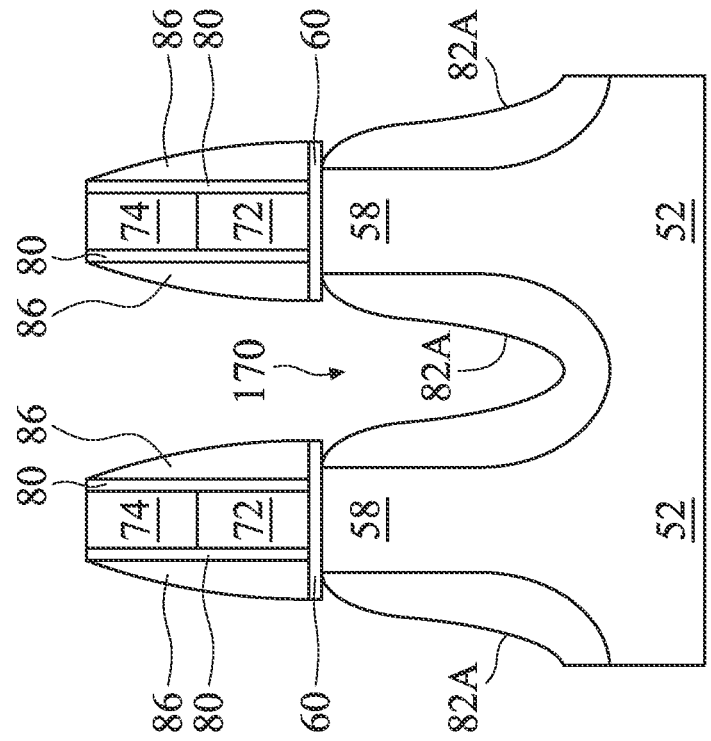
Figure 13A:
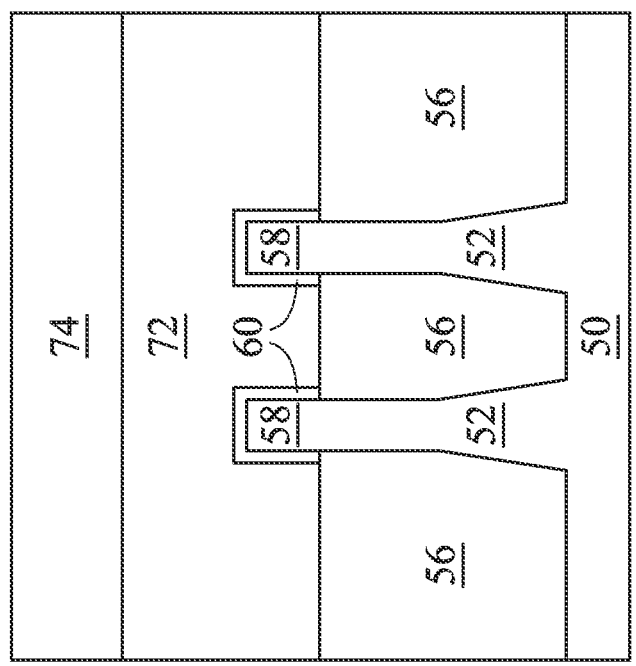

In FIGS. 13A and 13B, the epitaxial source/drain regions 82 in the region 50N and in the region 50P are begun to be epitaxially grown in the recesses 170. In some embodiments, such as illustrated in FIGS. 13A and 13B, the epitaxial source/drain regions 82 may be grown in two or more stages. FIGS. 13A and 13B illustrate first stage source/drain regions 82A after a first stage of epitaxial growth. Due to the high heat treatment 160 and optional hydrogen radical treatment 165, the uniformity of the first stage source/drain regions 82A is improved. Because the first stage source/drain regions 82A serve as the foundation for growing the remainder of the epitaxial source/drain regions 82, the uniformity of the first stage source/drain regions 82A also improves the remainder of the subsequently formed epitaxial source/drain regions 82.

Figure 14B:
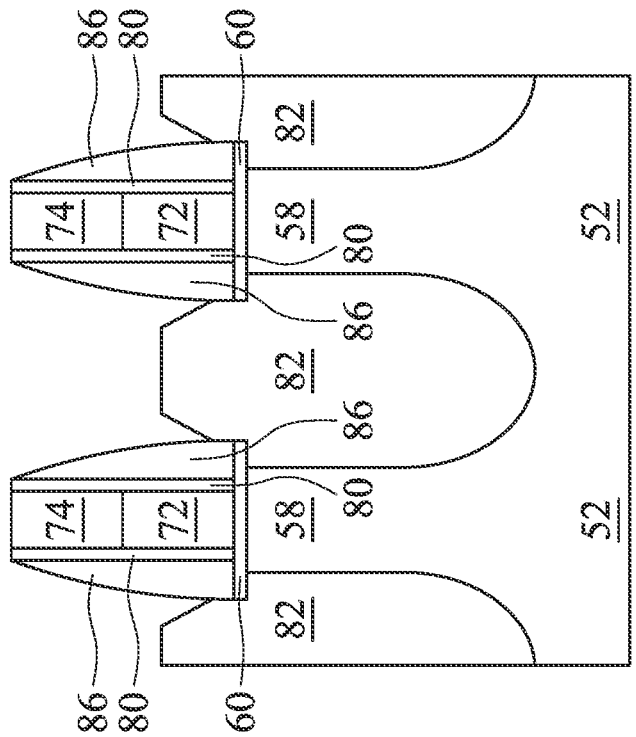
Figure 14A:
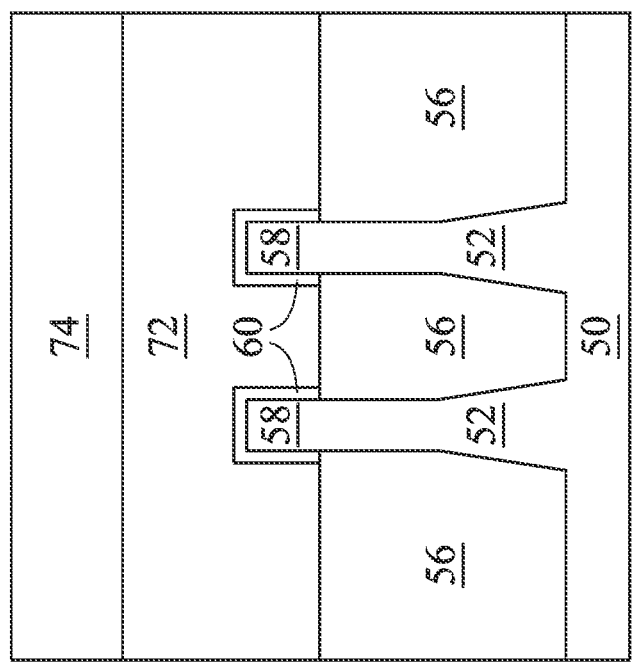
Figure 14C:
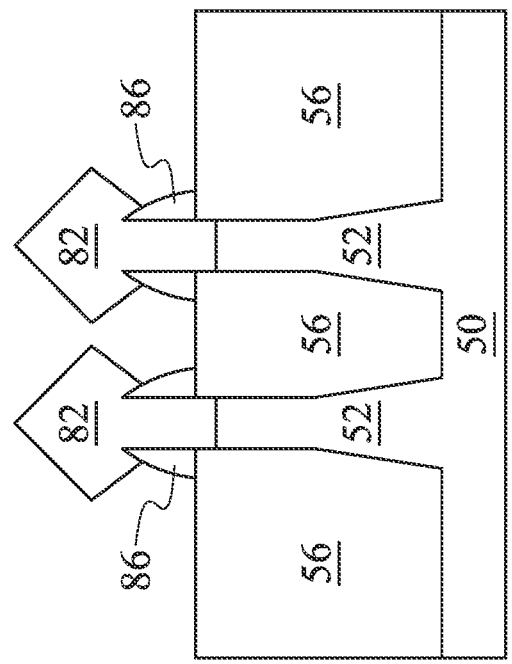
Figure 14D:
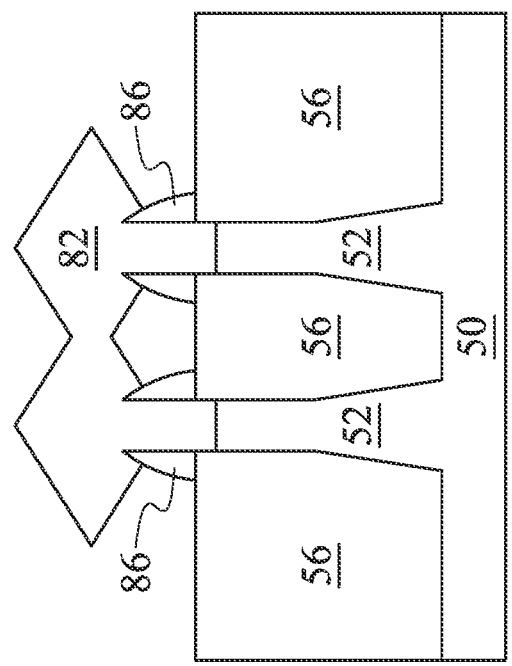

In FIGS. 14A and 14B, the remainder of the epitaxial source/drain regions 82 are formed. In the region 50N, the epitaxial source/drain regions 82 (including the first stage source/drain regions 82A) may include any acceptable material, such as appropriate for n-type FinFETs. For example, if the fin 52 is silicon, the epitaxial source/drain regions 82 in the region 50N may include materials exerting a tensile strain in the channel region 58, such as silicon, silicon carbide, phosphorous doped silicon carbide, silicon phosphide, or the like. The epitaxial source/drain regions 82 in the region 50N may have surfaces raised from respective surfaces of the fins 52 and may have facets.

In the region 50P, the epitaxial source/drain regions 82 (including the first stage source/drain regions 82A) may include any acceptable material, such as appropriate for p-type FinFETs. For example, if the fin 52 is silicon, the epitaxial source/drain regions 82 in the region 50P may comprise materials exerting a compressive strain in the channel region 58, such as silicon-germanium, boron doped silicon-germanium, germanium, germanium tin, or the like. The epitaxial source/drain regions 82 in the region 50P may also have surfaces raised from respective surfaces of the fins 52 and may have facets.

Because the epitaxial source/drain regions 82 have a high quality, the landing area for a subsequently formed contact is increased. For example, in some embodiments, the landing area may be increased in size from between about 50 $nm^2$ and 100 $nm^2$ to between about 150 $nm^2$ and 200 $nm^2$. Thus, embodiments can increase the landing area between 200% and about 300% over untreated recess openings. Having a larger landing area means that the lithographic tolerances are looser and as a result, more contacts may successfully be made, thereby increasing the overall device yield. Also, because the epitaxy growth is good, a boost in the Ion-Ioff ratio of the device may be achieved, where Ion is the maximum or activation current and Ioff is the leakage current. Thus, the device efficiency may be increased and the drive current (Ideff) necessary to operate the device may be decreased. In particular, as indicated above, the leakage current (Ioff) is decreased through the high heat treatment 160 and optional hydrogen radical treatment 165.

The epitaxial source/drain regions 82 (including the first stage source/drain regions 82A) and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

As a result of the epitaxy processes used to form the epitaxial source/drain regions 82 in the region 50N and the region 50P, upper surfaces of the epitaxial source/drain regions have facets which expand laterally outward beyond sidewalls of the fins 52. In some embodiments, these facets cause adjacent epitaxial source/drain regions 82 of a same FinFET to merge as illustrated by FIG. 14C. In other embodiments, adjacent epitaxial source/drain regions 82 remain separated after the epitaxy process is completed as illustrated by FIG. 14D. In the embodiments illustrated in FIGS. 14C and 14D, gate spacers 86 are formed covering a portion of the sidewalls of the fins 52 that extend above the STI regions 56 thereby blocking the epitaxial growth. In some other embodiments, the spacer etch used to form the gate spacers 86 may be adjusted to remove the spacer material to allow the epitaxially grown region to extend to the surface of the STI region 56.

Figure 15B:
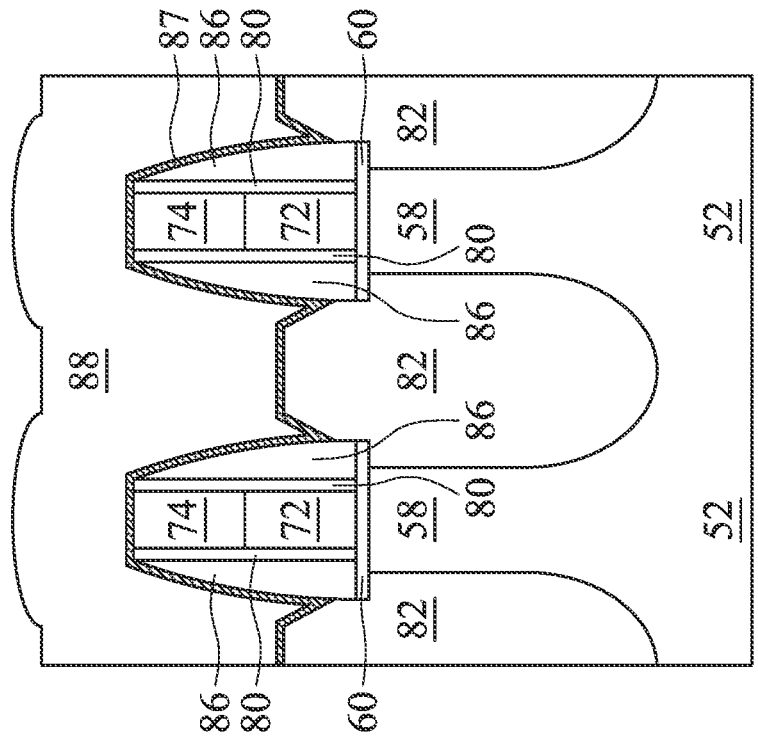
Figure 15A:
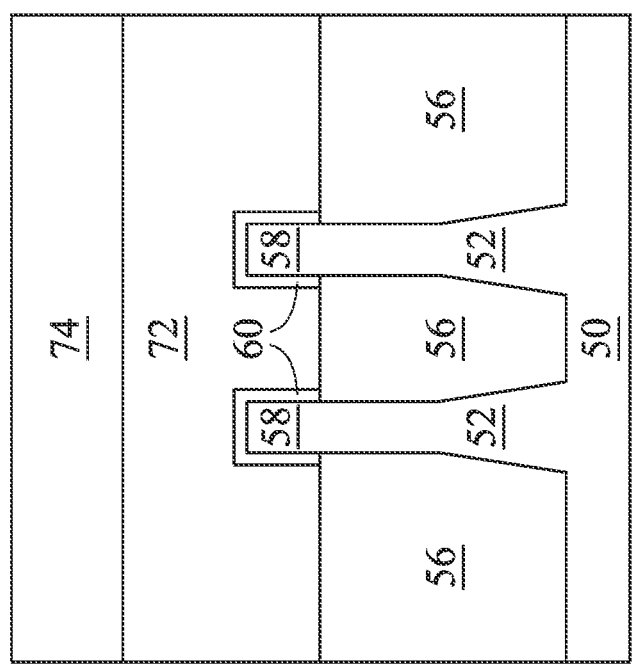

In FIGS. 15A and 15B, a first interlayer dielectric (ILD) 88 is deposited over the structure illustrated in FIGS. 10A and 10B. The first ILD 88 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 87 is disposed between the first ILD 88 and the epitaxial source/drain regions 82, the masks 74, and the gate spacers 86. The CESL 87 may comprise a dielectric material, such as, silicon nitride, silicon oxide, silicon oxynitride, or the like, having a different etch rate than the material of the overlying first ILD 88.

Figure 16B:
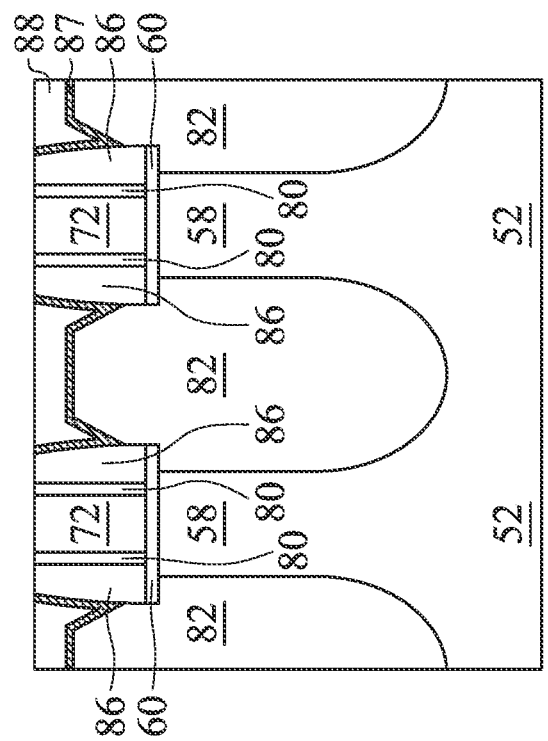
Figure 16A:
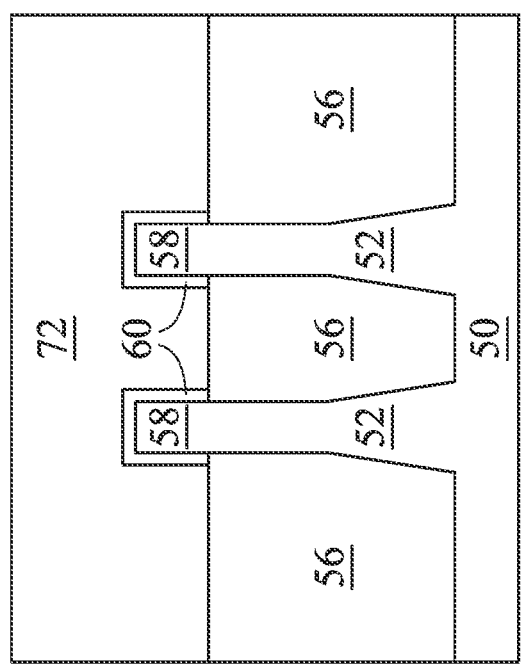

In FIGS. 16A and 16B, a planarization process, such as a CMP, may be performed to level the top surface of the first ILD 88 with the top surfaces of the dummy gates 72 or the masks 74. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88. In some embodiments, the masks 74 may remain, in which case the planarization process levels the top surface of the first ILD 88 with the top surfaces of the top surface of the masks 74.

Figure 17B:
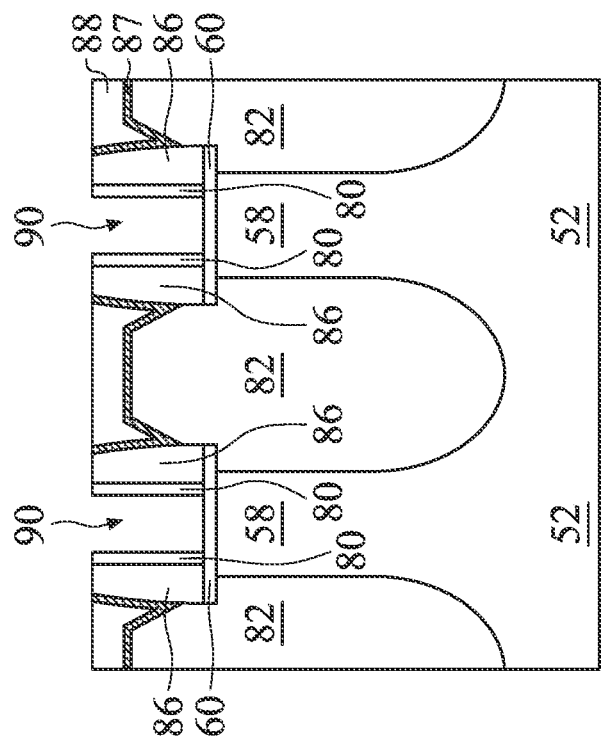
Figure 17A:
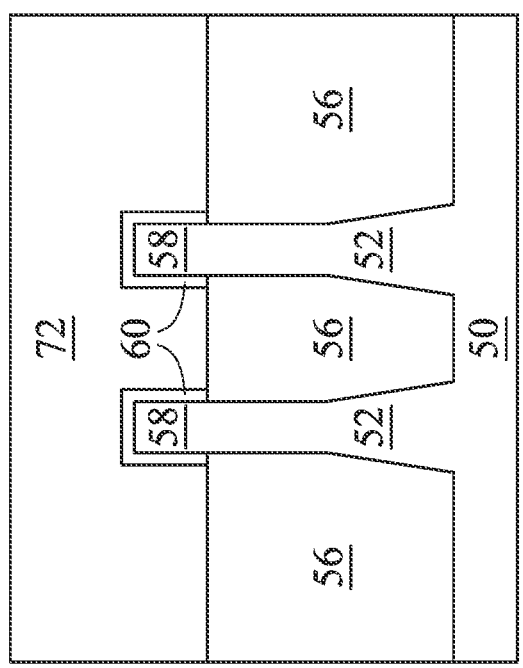

In FIGS. 17A and 17B, the dummy gates 72, and the masks 74 if present, are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes and/or overlies a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 18B:
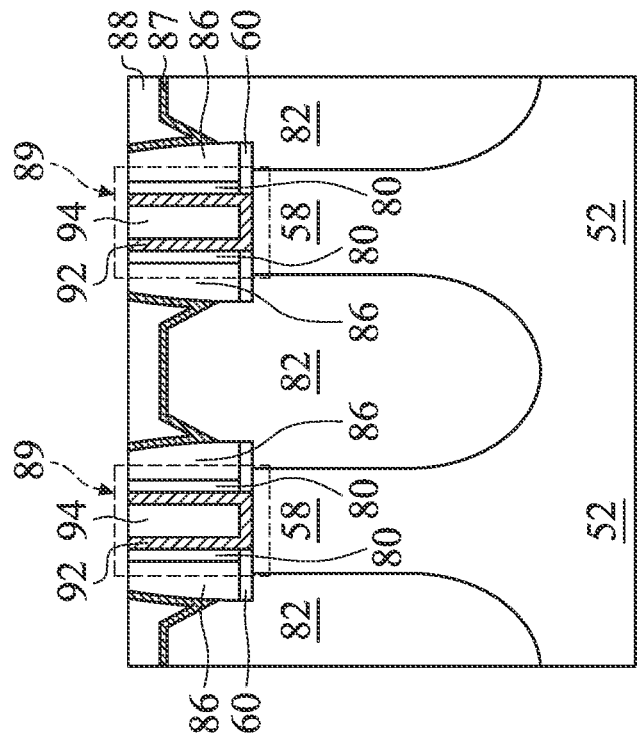
Figure 18A:
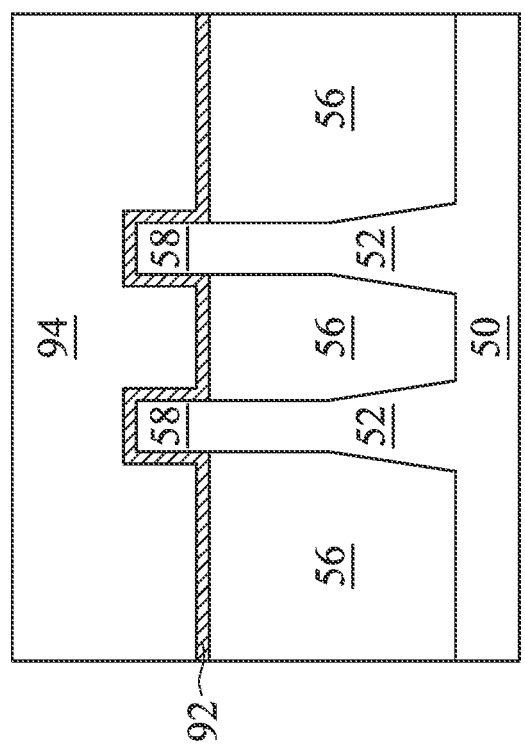

In FIGS. 18A and 18B, gate dielectric layers 92 and gate electrodes 94 are formed for replacement gates. FIG. 18C illustrates a detailed view of region 89 of FIG. 18B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on the top surface of the first ILD 88. In accordance with some embodiments, the gate dielectric layers 92 comprise silicon oxide, silicon nitride, or multilayers thereof. In some embodiments, the gate dielectric layers 92 include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof. The formation methods of the gate dielectric layers 92 may include Molecular-Beam Deposition (MBD), ALD, PECVD, and the like. In embodiments where portions of the dummy dielectric layer 60 remains in the recesses 90, the gate dielectric layers 92 include a material of the dummy dielectric layer 60 (e.g., SiO$_2$).

The gate electrodes 94 are deposited over the gate dielectric layers 92, respectively, and fill the remaining portions of the recesses 90. The gate electrodes 94 may include a metal-containing material such as titanium nitride, titanium oxide, tantalum nitride, tantalum carbide, cobalt, ruthenium, aluminum, tungsten, combinations thereof, or multi-layers thereof. For example, although a single layer gate electrode 94 is illustrated in FIG. 18B, the gate electrode 94 may comprise any number of liner layers 94A, any number of work function tuning layers 94B, and a fill material 94C as illustrated by FIG. 18C. After the filling of the recesses 90, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 19B:
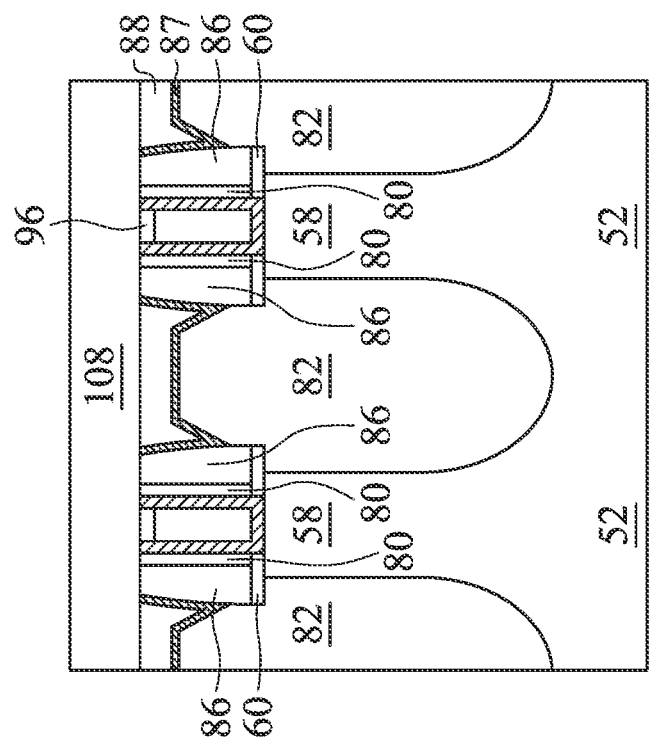
Figure 19A:
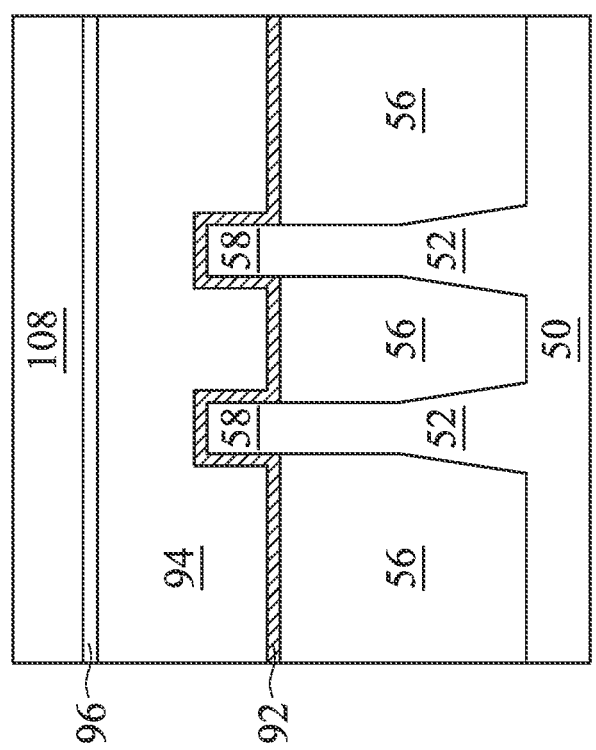

In FIGS. 19A and 19B, a second ILD 108 is deposited over the first ILD 88. In some embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD. In accordance with some embodiments, before the formation of the second ILD 108, the gate stack (including a gate dielectric layer 92 and a corresponding overlying gate electrode 94) is recessed, so that a recess is formed directly over the gate stack and between opposing portions of gate spacers 86, as illustrated in FIGS. 19A and 19B. A gate mask 96 comprising one or more layers of dielectric material, such as silicon nitride, silicon oxynitride, or the like, is filled in the recess, followed by a planarization process to remove excess portions of the dielectric material extending over the first ILD 88. The subsequently formed gate contacts 110 (FIGS. 16A and 16B) penetrate through the gate mask 96 to contact the top surface of the recessed gate electrode 94.

Figure 20B:
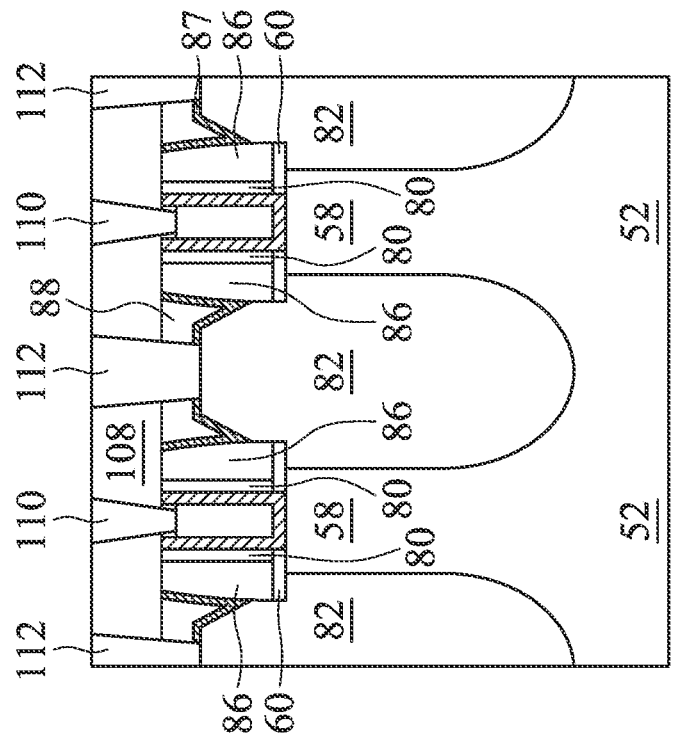
Figure 20A:
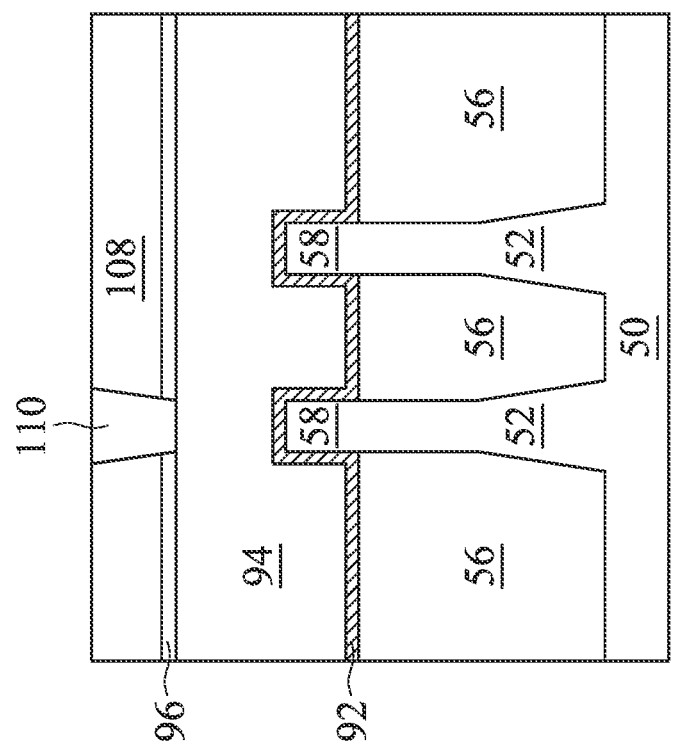

In FIGS. 20A and 20B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108 and the gate mask 96. The openings may be formed using acceptable photolithography and etching techniques. Because the epitaxial source/drain regions 82 have a higher quality, a landing area for the source/drain contacts 112 is increased. This allows for a more tolerant lithographic window to form the openings for the source/drain contacts 112. As a result, the overall yield may be increased.

A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 106. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts. Because of the greater landing area provided in the epitaxial source/drain regions 82 by the processes described herein, the corresponding source/drain contacts 112 may achieve a better electrical and physical connection to the epitaxial source/drain regions 82.

Figure 21:
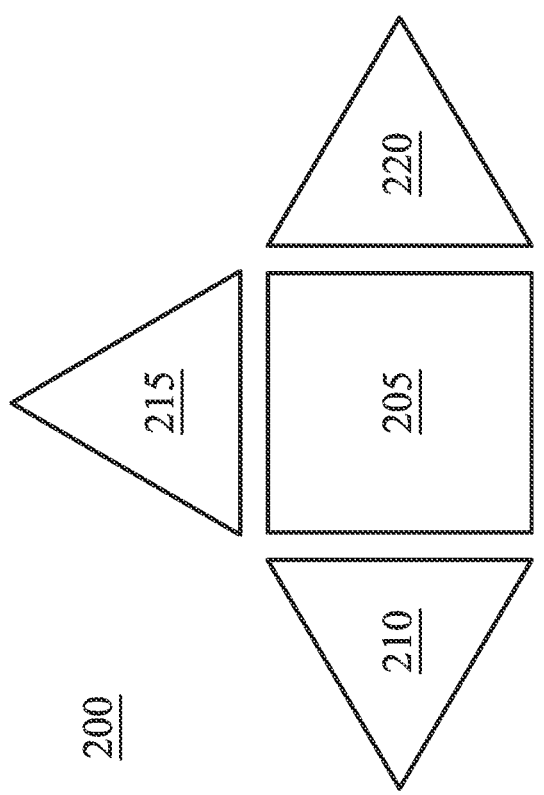
FIGS. 21 and 22 are views of processing tools, in accordance with some embodiments.

In FIG. 21, a block diagram of a processing tool 200 is illustrated, in accordance with some embodiments. Processing tool 200 includes a mainframe 205 which includes control capabilities and robotics to move a workpiece from chamber to chamber of the processing tool 200. The mainframe 205 may also be configured to receive the workpiece at a load port and to provide the workpiece to an export port of the processing tool 200. The mainframe 205 may also be configured to move the workpiece to other tools and/or chambers within the processing tool 200, which are not shown in FIG. 21.

Processing chamber 210 is a processing chamber where u-shaped recesses, such as the recesses 150 are formed in the substrate 50 (see FIG. 10B). Following formation of the recesses 150 in the substrate 50, the mainframe 205 may move the workpiece having the substrate 50 from the processing chamber 210 to the processing chamber 215, where the processes described above relating to the high heat treatment 160 and optional hydrogen radical treatment 165 may be performed (see FIGS. 11B and 12B). In some embodiments, while the workpiece is moved from the processing chamber 210 to the processing chamber 215, a vacuum in processing chamber 210 may be broken, allowing ambient air to contact the substrate 50 and oxidize the substrate 50 and affect the residues 155 from the process forming recesses 150. In other embodiments, a vacuum may be maintained while the workpiece is moved from the processing chamber 210 to the processing chamber 215. Following the processing in the processing chamber 215, the mainframe 205 may move the workpiece to another processing chamber 220 for epitaxially growing the epitaxial source/drain regions 82.

Figure 22:
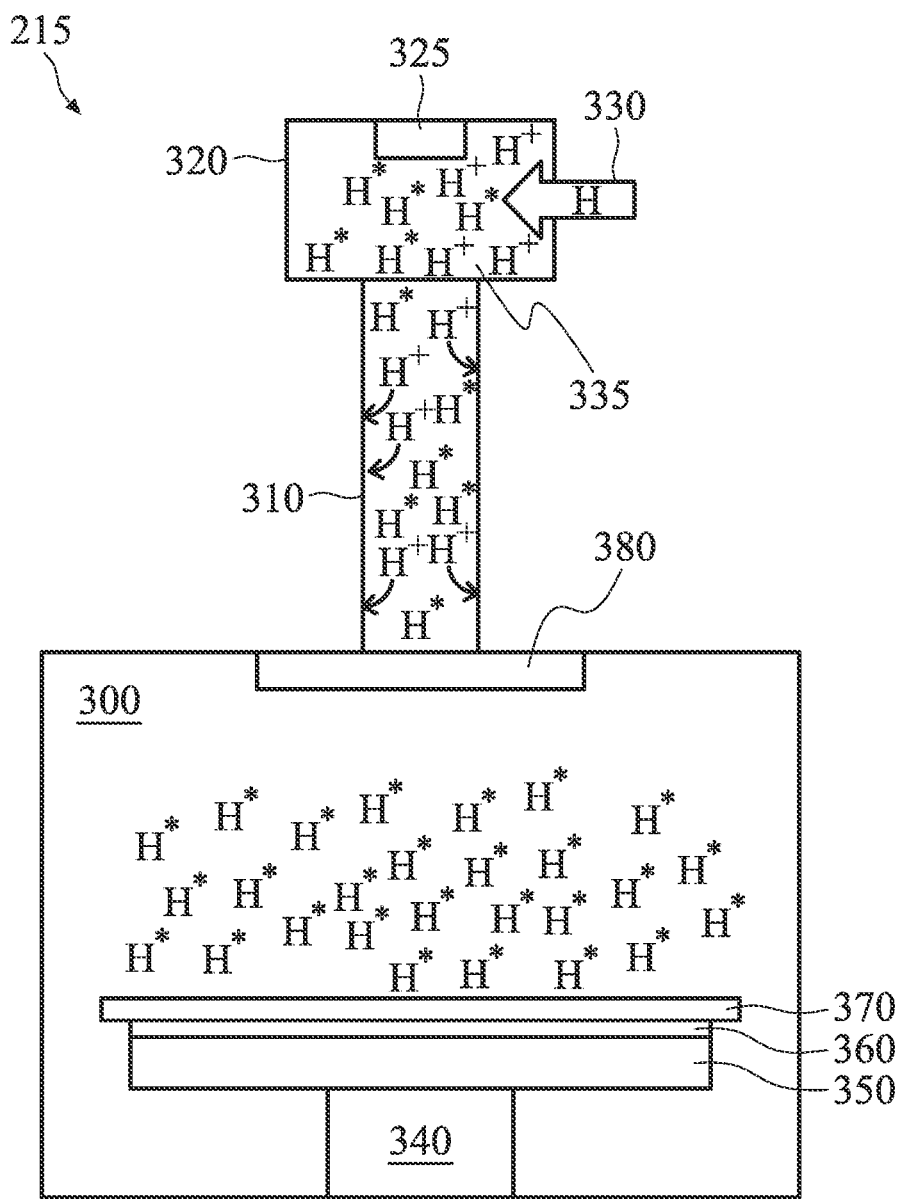

In FIG. 22, the processing chamber 215 of FIG. 21 is illustrated in greater detail. The processing chamber 215 includes a working chamber 300. The processing chamber 215 may also include a remote plasma chamber 320 with a transfer chamber 310 connecting the working chamber 300 to the remote plasma chamber 320. A pedestal 350 may be supported by a mechanism 340 to move the pedestal up or down. The pedestal 350 may be heated and may be made of a metal alloy such as aluminum nitride ($AlN_x$) or other suitable material to provide uniform heat distribution of the heat in the pedestal 350. A workpiece 370 may be placed in the working chamber on the pedestal 350. To prevent dissipation or leaching of materials from the heated pedestal 350 to the workpiece 370 during the high heat treatment 160, a metal coating 360 may be formed over the pedestal 350. A heated shower head 380 may be disposed in the working chamber 300 over the workpiece 370 to provide additional heat to the workpiece 370 and optionally to provide products of a remote plasma 335 to the working chamber 300.

The high heat treatment 160 may be performed by activating the heated pedestal 350 and the heated shower head 380 in the working chamber 300, until the temperature of the workpiece 370 reaches between 700° C. and 900° C. for a duration between 60 sec and 120 sec.

The hydrogen radical treatment 165 may be performed by activating the remote plasma generator 325 and providing a source gas 330 to the remote plasma chamber 320. The remote plasma generator 325 generates a plasma from the source gas 330, such as hydrogen gas. The remote plasma 335 products may include radicals and ions of the hydrogen, as well as plasma effluents. By generating a remote plasma, the effluents and ions may be filtered out of the remote plasma 335 during the transfer of the remote plasma 335 to the working chamber 300 by means of the transfer chamber 310. The walls of the transfer chamber 310 or plates disposed in the transfer chamber 310 may be charged, so that when ions of the hydrogen pass through, the ions are attracted to the charged surfaces and neutralized.

In some embodiments, the hydrogen radical treatment 165 may be performed simultaneously with or overlapping with the high heat treatment 160. The higher temperature during the hydrogen radical treatment will provide higher dissociation in hydrogen radicals. In other embodiments, the hydrogen radical treatment 165 may be performed without performing the high heat treatment 160. In such embodiments, the hydrogen radical treatment 165 is performed at a temperature greater than 250° C. to provide sufficient energy for generating sufficient hydrogen radicals.

FIGS. 23 through 24 illustrate processes of forming and removing the metal coating 360 from the pedestal 350, in accordance with some embodiments. In some embodiments, the pedestal 350 may be coated in situ, without removing the pedestal 350 from the processing chamber 215. In FIG. 23, at 410, the chamber is emptied so that no workpiece is in the chamber. At 420, the metal coating 360 is deposited on the pedestal 350. Any suitable deposition process may be used such as physical vapor deposition (PVD), CVD, sputter deposition, or other techniques known and used in the art for depositing the selected material. The material of the metal coating 360 may include any suitable material such as iron, cobalt, nickel, and the like. The metal coating 360 may be deposited to a thickness between about 1 μm and about 10 μm, such as about 5 μm, though other thicknesses may be used. If the metal coating 360 is too thin, then materials from the pedestal 350 may still leach into the workpiece 370. If the metal coating 360 is too thick, then the heat provided from the pedestal 350 may not be applied in the intended way to the workpiece 370, resulting in undesired effects. At 430, a wafer or workpiece 270 may be loaded for processing. In FIG. 24, the metal coating 360 may be removed from the pedestal 350. This may be done so that the processing chamber 215 may be used for other processing functions. At 440, the processing chamber 215 may be emptied of any workpiece, thereby exposing the pedestal 350. At 450, the metal coating 360 may be removed from the pedestal by any suitable process, such as by etching. At 460, processing in the processing chamber 215 may be resumed.

Embodiments provide a way of treating recesses with a high heat treatment and an optional hydrogen plasma treatment. These treatments improve the surface quality of the recesses so that epitaxial source/drain regions deposited in the recesses have a higher quality, resulting in less leakage current and a more efficient device. Processing devices may include a processing chamber for providing the high heat treatment which includes a heated platform which is coated with a metal to prevent diffusion of platform materials into the workpiece and a heated shower head, which together provide the high heat for the workpiece. The processing chamber may also include a remote plasma source for providing hydrogen radicals to the workpiece for a hydrogen radical treatment. The resulting device has increased drive current performance. In particular, the ratio of the drive current (Ideff) to the leakage current (Ioff) may be increased by 3% to 4%. In other words, the leakage current is reduced. Also, Ion may be boosted by the better epitaxy growth of the source/drain regions achieved by the processes described herein. Further, the yield window for better landing for a subsequently formed contact may be achieved. In other words, because the epitaxy has a higher quality, the upper surfaces of the epitaxy have a larger effective landing area to receive a contact, thereby allowing a more tolerant lithographic window to create source/drain contacts and increasing overall yield.

One embodiment is a method including forming a fin from a substrate, forming a gate structure over the fin, and etching a source/drain recess on a side of the gate structure. The source/drain recess is heated at a temperature greater than 700° C. thereby smoothing a surface of the source/drain recess by 6% to 12%, and an epitaxial source/drain region is grown in the source/drain recess.

Another embodiment is a method including etching a substrate to form a fin therefrom. The method includes forming a gate structure over the fin, the gate structure including a gate stack, a first gate spacer on a first side of the gate stack, and a second gate spacer on a second side of the gate stack. A recess is etched in the fin on the first side of the gate structure adjacent the first gate spacer. The recess is treated to remove etching byproducts and oxides of a material of the fin from surfaces in the recess and to smooth the surfaces of the recess. An epitaxial source/drain region is formed in the recess.

Another embodiment is a device including a remote plasma chamber, the remote plasma chamber including a plasma generator and a gas source. The device also includes a plasma transfer chamber and a working chamber, where the working chamber includes a shower head and a pedestal. The shower head and the pedestal are configured to be heated to provide a heat of at least 700° C. to a workpiece on the pedestal. The pedestal includes a metal alloy and a metal coating over the metal alloy. The plasma transfer chamber connects the remote plasma chamber to the working chamber and is configured to provide products of a plasma to the working chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin from a substrate;
   forming a gate structure over the fin;
   etching a source/drain recess on a side of the gate structure;
   performing a smoothing process, the smoothing process comprising:
      supplying hydrogen gas to a surface of the source/drain recess; and
      heating the source/drain recess, wherein during heating the source/drain recess a metal layer covers a pedestal, the pedestal supporting the substrate;
   following the smoothing process, performing a radical treatment process to the source/drain recess;
   moving the source/drain recess to a deposition chamber; and
   growing an epitaxial source/drain region in the source/drain recess.

2. The method of claim 1, wherein heating the source/drain recess comprises:
activating a heated pedestal and heated shower head to heat the source/drain recess to a temperature between 700° C. and less than 900° C.

3. The method of claim 1, wherein the smoothing process reduces a root-mean-square (RMS) of a surface of the source/drain recess by 6% to 12%.

4. The method of claim 1, wherein the radical treatment process utilizes hydrogen radicals.

5. The method of claim 4, wherein the radical treatment process forms a silane on a surface of the source/drain recess, the silane inhibiting oxidation of the source/drain recess during moving the source/drain recess to the deposition chamber.

6. The method of claim 4, wherein the radical treatment process expands the source/drain recess to be wider and deeper.

7. The method of claim 1, wherein after moving the source/drain recess to the deposition chamber, performing an etching process to remove the metal layer from the pedestal.

8. The method of claim 1, wherein the metal layer has a thickness in a range of 1 μm to 10 μm.

9. A method comprising:
etching a substrate to form a fin therefrom;
forming a gate structure over the fin, the gate structure comprising a gate stack, a first gate spacer on a first side of the gate stack, and a second gate spacer on a second side of the gate stack;
etching a recess in the fin on the first side of the gate structure adjacent the first gate spacer;
performing a treatment on the recess to reduce a surface roughness of the recess, wherein during reducing the surface roughness of the recess, a metal layer is interposed between the substrate and a pedestal supporting the substrate, the treatment occurring with the recess in a gaseous hydrogen environment;
generating a hydrogen plasma, thereby creating hydrogen radicals and applying the hydrogen radicals to the recess;
transferring the substrate to a deposition chamber; and
forming an epitaxial source/drain region in the recess.

10. The method of claim 9, wherein treating the recess comprises:
providing a heated treatment to the recess, the heated treatment heating the recess between 700° C. and 900° C.

11. The method of claim 9, wherein reducing the surface roughness of the recess comprises:
heating a heating element disposed above the recess to provide heat to the recess; or
heating a pedestal under the recess to provide heat to the recess.

12. The method of claim 9, wherein the metal layer is disposed on the pedestal, further comprising:
removing the metal layer from the pedestal following transferring the substrate to the deposition chamber.

13. The method of claim 9, wherein applying the hydrogen radicals enlarges the recess, lateral extents of the recess extending below the first gate spacer.

14. The method of claim 9, wherein applying the hydrogen radicals to the recess forms a hydrogen compound at a surface of the recess, the hydrogen compound comprising a material of the fin and hydrogen, the hydrogen compound inhibiting oxidation of the material of the fin during the transferring the substrate to the deposition chamber.

15. The method of claim 9, wherein the metal layer comprises iron, cobalt, or nickel.

16. A method comprising:
forming a fin from a substrate;
forming a gate structure over the fin;
etching a source/drain recess on a side of the gate structure;
removing etching byproducts from the source/drain recess, wherein during removing the etching byproducts a metal layer covers a pedestal that supports the substrate in a processing chamber, the metal layer disposed between the pedestal and the substrate;
exposing the source/drain recess to hydrogen radicals, forming a hydrogen compound at a surface of the source/drain recess;
transferring the substrate to a deposition chamber; and
growing an epitaxial source/drain region in the source/drain recess.

17. The method of claim 16, wherein removing the etching byproducts from the source/drain recess comprises:
heating the source/drain recess to a temperature between 700° C. and 900° C. by a heated pedestal or overhead heated shower head in a hydrogen gas ambient environment.

18. The method of claim 16, wherein removing the etching byproducts causes the surface of the source/drain recess to become smoother, reducing a root-mean-square (RMS) of the surface of the source/drain recess by 6% to 12%.

19. The method of claim 16, further comprising:
before removing etching byproducts from the source/drain recess, depositing the metal layer over the pedestal of the processing chamber.

20. The method of claim 16, wherein exposing the source/drain recess to hydrogen radicals causes the source/drain recess to widen, causing a sidewall of the source/drain recess to be under the gate structure.

* * * * *